United States Patent
Sano

(10) Patent No.: US 6,859,106 B2
(45) Date of Patent: Feb. 22, 2005

(54) PLL CIRCUIT AND PHASE DIFFERENCE DETECTING CIRCUIT THAT CAN REDUCE PHASE PULL-IN TIME AND ADJUST A SKEW AT A HIGHER PRECISION

(75) Inventor: Masaki Sano, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 67 days.

(21) Appl. No.: 10/461,389

(22) Filed: Jun. 16, 2003

(65) Prior Publication Data

US 2003/0231064 A1 Dec. 18, 2003

(30) Foreign Application Priority Data

Jun. 17, 2002 (JP) ........................................ 2002-176011

(51) Int. Cl.[7] ................................................. H03L 7/10
(52) U.S. Cl. .......................... 331/1 A; 331/11; 331/17; 331/45; 331/57; 331/179
(58) Field of Search .............................. 331/1 A, 2, 10, 331/11, 16–18, 25, 34, 45, 57, 177 R, 179, DIG. 2; 327/156–159; 332/127; 360/51; 375/376; 455/260

(56) References Cited

U.S. PATENT DOCUMENTS 6,356,158 B1 * 3/2002 Lesea .......................... 331/11

FOREIGN PATENT DOCUMENTS

JP  8-274629  10/1996
JP  9-326692  12/1997

* cited by examiner

Primary Examiner—David Mis
(74) Attorney, Agent, or Firm—Dickstein, Shapiro, Morin & Oshinsky, LLP

(57) ABSTRACT

A PLL circuit for comparing with a phase comparator 1a phase between an input signal and one of multiphase pulse signals CK0DIV to CKNDIV used as a channel clock generated by an output of a controlled oscillator 5, and controlling an oscillation of the controlled oscillator 5 according to a phase difference signal, comprises a frequency fixing circuit 9 for outputting an activating signal PCSTART for the control when the input signal is nearly equivalent to a frequency of the channel clock and has entered into a capture range of the phase comparator and a selection circuit 7 for selecting as the channel clock a multiphase pulse signal of a closest phase to a generating point of the input signal after generation of the activating signal, and the selection circuit 7 decides whether the input signal is advanced or delayed with respect to the channel clock after having selected a multiphase pulse signal as the channel clock and generates either an advance signal or delay signal according to the advance/delay of the input signal, for controlling a skew adjusting circuit 8 with the advance signal or delay signal.

15 Claims, 13 Drawing Sheets

750a(750b)

PLL CIRCUIT AND PHASE DIFFERENCE DETECTING CIRCUIT THAT CAN REDUCE PHASE PULL-IN TIME AND ADJUST A SKEW AT A HIGHER PRECISION

This application is based on Japanese patent application NO. 2002-176011, the content of which is incorporated hereinto by reference.

BACKGROUND OF THE INVENTION

1. Field of the Invention

The present invention relates to a PLL (Phase Lock Loop) circuit provided with a multiphase VCO (voltage-controlled oscillator)/ICO (current-controlled oscillator), particularly to a PLL circuit and a phase difference detecting circuit that can reduce phase pull-in time and adjust a skew at a higher precision.

2. Description of the Related Art

A device designed for reading out data stored in a DVD or a CD-ROM used in a personal computer or a video player is provided with a PLL circuit that operates in synchronism with an input signal called EFM, to generate a signal synchronized with the input signal. In such an apparatus, reduction of a pull-in time of the PLL circuit from entry of the input signal until becoming ready for reading out data is a critical factor to determine its performance. Also, in case where a phase difference between the input signal and a clock generated by the PLL circuit, i.e. a skew is large a reading error is prone to be caused, therefore it is essential for the PLL circuit to be capable of adjusting the skew at a high precision. For these reasons a PLL circuit and a phase difference detecting circuit that can reduce phase pull-in time and adjust a skew precisely and easily are being sought for.

Referring to operation of a conventional PLL circuit for phase-locking with an input signal, such method is known wherein a phase of a controlled oscillator (ICO) in which delay cells (delay elements, DCEL) are connected in a ring shape for oscillating multiphase signals is synchronized with an output of a separate reference clock oscillating circuit, so that one of the multiphase signals that is closest to a phase of the input signal is selected and output, out of the oscillation output. (Japanese Laid-open patent application No. 8-274629, Japanese Laid-open patent application No. 9-326692).

Likewise, such method utilizing a controlled oscillator (ICO) in which delay cells are connected in a ring shape is also known wherein phase lock by a PLL circuit is achieved through the steps of outputting a clock from a first stage of the controlled oscillator; feeding back the output in a form of a channel clock signal (channel clock) to a phase comparator for comparing the phase with the input signal; controlling an oscillating frequency of the controlled oscillator (ICO) with an output of the phase comparator, so that a phase difference between the input signal and the channel clock becomes minimal.

FIG. 13 is a schematic diagram showing a constitution of the latter PLL circuit. This PLL circuit is constituted of a phase comparator 1a for comparing a phase of an input signal and a channel clock, a charge pump circuit 2a to be controlled by an output of the phase comparator 1a, a low-pass filter (LPF filter) 3a for extracting a low frequency signal out of an output of the charge pump circuit 2a, a voltage/current converting circuit (VI converting circuit) 4a for converting an output of the LPF filter 3a into a current value, a controlled oscillator (ICO) 5a an oscillating frequency thereof is controlled by an output of the voltage/current converting circuit 4a and in which delay cells for outputting a plurality of multiphase signals are connected in a ring shape, a frequency dividing circuit 6a for dividing a frequency of a particular output out of the plurality of outputs of the controlled oscillator 5a to output the channel clock, a skew adjusting circuit 7a for inputting an advance signal and a delay signal and adding a control signal to the output of the charge pump circuit 2a, and a frequency fixing circuit 8a for controlling activation of the PLL circuit operation.

The PLL circuit according to FIG. 13 is designed to compare a phase of the input signal and of the channel clock at the phase comparator 1a and to feed back a phase difference signal (rising instruction signal and falling instruction signal) to the controlled oscillator (ICO) 5a through the charge pump circuit 2a, LPF filter 3a and voltage/current converting circuit 4a. The frequency fixing circuit 8a adds, prior to the above operation of the PLL circuit, a control current I_Fin to output current Iin of the voltage/current converting circuit 4a so that a frequency of the input signal and of the channel clock becomes equal and adjusts input current I_icoin of the controlled oscillator (ICO) 5a. Then once the frequency of the channel clock enters into a capture range of the phase comparator 1a, the frequency fixing circuit 8a outputs a PCSTART signal (from a low level toward a high level) to activate the phase comparator 1a, and maintains the control current I_Fin after outputting the PCSTART signal at a high level.

In such conventional PLL circuits provided with a controlled oscillator that oscillates multiphase signals, including both the former and the latter, an oscillating frequency of the controlled oscillator is analogically controlled by a phase difference output from the phase comparator through the LPF filter from the beginning of its action, therefore they have the problem that a long pull-in time is required before phase locking is achieved. Also, though a phase difference (skew) between the input signal and the controlled oscillator can be reduced by providing a skew adjusting circuit for controlling from outside, since the PLL circuit is not provided with means of generating a control signal (advance signal and delay signal) for skew adjustment, a high-precision skew adjustment is not feasible, and consequently it is impossible to successfully achieve the purpose required from a PLL circuit, i.e. a sufficiently high precision in the phase locking.

In view of the foregoing, it is an object of the invention to provide a PLL circuit and a phase difference detecting circuit capable of pulling in a phase at a high-speed.

It is another object of the invention to provide a PLL circuit and a phase difference detecting circuit that can perform a high-precision skew adjustment.

SUMMARY OF THE INVENTION

A PLL circuit according to the present invention, comprises a controlled oscillator (for example, numeral 5 shown in FIG. 1) for outputting multiphase pulse signals; a phase comparator (for example, numeral 1 shown in FIG. 1) for comparing a phase between an input signal and one of the multiphase pulse signals used as a channel clock to generate a phase difference signal, and controlling an oscillation of the controlled oscillator according to the phase difference signal; a frequency fixing circuit (for example, numeral 9 shown in FIG. 1) for outputting an activating signal for the controlling when the input signal is nearly equivalent to a frequency of the channel clock and has entered into a capture range of the phase comparator; and a selection circuit (for example, numeral 7 shown in FIG. 1) for selecting one of the multiphase pulse signals which has a closest phase to a generating point of the input signal after generation of the activating signal as the channel clock.

The PLL circuit according to the invention may further comprise a skew adjusting circuit (for example, numeral 8 shown in FIG. 1) for adjusting a skew of the controlled oscillator, and the selection circuit decides whether the input signal is advanced or delayed with respect to the channel clock after having selected a multiphase pulse signal as the channel clock and generates either an advance signal or delay signal according to the advance/delay of the input signal, for controlling the skew adjusting circuit with the advance signal or the delay signal.

In the PLL circuit according to the invention, the skew adjustment circuit may control an oscillation of the controlled oscillator on behalf of the phase comparator, after generation of the advance signal or the delay signal.

Also, in the PLL circuit according to the invention, the selection circuit may comprise an anterior stage latch circuit (for example, numerals 711 through 714 shown in FIG. 3) for latching a multiphase pulse signal by the input signal and outputting a phase information (for example, SEL01 to SEL70 and SEL01B to SEL70B shown in FIG. 3) of a multiphase pulse signal of a closest phase to the latching point; a posterior stage latch circuit (for example, numerals 715, 716 shown in FIG. 3) for latching an output of the anterior stage latch circuit at a single generating point (for example, a first varying point) of an input signal after generation of the activating signal; and a phase control signal generation circuit (for example, numerals 73, 74, 75 shown in FIG. 3) for selectively outputting the channel clock based on an output status of the posterior stage latch circuit and the multiphase pulse signal, and outputting an advance signal or a delay signal in accordance with a phase difference between the input signal and the channel clock based on variation of an output status of the anterior stage latch circuit in response to the output status of the posterior stage latch circuit.

In the PLL circuit according to the invention, the anterior stage latch circuit may include a first anterior stage latch circuit (for example, numerals 711, 713 shown in FIG. 3) for latching a multiphase signal at a front edge of the input signal and a second anterior stage latch circuit (for example, numerals 712, 714 shown in FIG. 3) for latching the multiphase pulse signal at a rear edge of the input signal; and the posterior stage latch circuit may include a first posterior stage latch circuit (for example, numeral 715 shown in FIG. 3) for latching an output of the first anterior stage latch circuit at a rear edge of the first input signal (a second varying point) after generation of the activating signal and a second posterior stage latch circuit (for example, numeral 716 shown in FIG. 3) for latching an output of the second anterior stage latch circuit at a front edge of the second input signal (a third varying point) after generation of the activating signal; and the PLL circuit may further comprise an edge selection circuit (for example, numeral 72 shown in FIG. 3) for outputting to the phase control signal generation circuit the output of the first and the second anterior stage latch circuit and the output of the first or the second posterior stage latch circuit latched first after generation of the activating signal.

In the PLL circuit according to the invention, the phase control signal generation circuit may comprise a clock selection circuit (for example, numeral 73 shown in FIG. 3) for selectively outputting the channel clock based on the output of the first or the second posterior stage latch circuit output by the edge selection circuit and the multiphase pulse signal; an advance/delay detecting circuit (for example, numeral 74 shown in FIG. 3) for generating a plurality of advance signals and delay signals having a pulse width corresponding to a phase difference of the multiphase pulse signal with respect to the channel clock; and an advance/delay output circuit (for example, numeral 75 shown in FIG. 3) for selectively outputting the plurality of either advance signals or delay signals according to an output of the edge selection circuit.

In the PLL circuit according to the invention, the advance/delay output circuit may comprise a first phase shift width detecting circuit (for example, numeral 752 shown in FIG. 6) for detecting a phase shift width with respect to the channel clock and a first advance/delay decision circuit (for example, 754 shown in FIG. 6) for deciding whether the phase shift is an advance or a delay, to both of which the output of the clock selection circuit corresponding to the output of the first anterior stage latch circuit is to be respectively input; a first advance/delay decision output circuit (for example, numeral 756 shown in FIG. 6) for selecting either an advance signal or a delay signal having a pulse width corresponding to the phase shift out of the plurality of advance signals or delay signals according to the phase shift width and advance/delay of the phase shift and outputting such advance signal or delay signal as a first advance decision signal or a first delay decision signal; a second phase shift width detecting circuit (for example, numeral 753 shown in FIG. 6) for detecting a phase shift width with respect to the channel clock and a second advance/delay decision circuit (for example, numeral 751 shown in FIG. 6) for deciding whether the phase shift is an advance or a delay, to both of which the output of the clock selection circuit corresponding to the output of the second anterior stage latch circuit is to be respectively input; a second advance/delay decision output circuit (for example, numeral 755 shown in FIG. 6) for selecting either an advance signal or a delay signal having a pulse width corresponding to the phase shift out of the plurality of advance signals or delay signals according to the phase shift width and advance/delay of the phase shift and outputting such advance signal or delay signal as a second advance decision signal or a second delay decision signal; and an output logic circuit (for example, numerals 757 and 759 shown in FIG. 6) for alternately switching and outputting the first advance decision signal or the second advance decision signal and the first delay decision signal or the second delay decision signal respectively as the advance signal and the delay signal, according to a logic status of the input signal.

A phase difference detecting circuit according to the invention is to be incorporated in a PLL circuit provided with a controlled oscillator for generating a multiphase pulse signal, and comprises an anterior stage latch circuit (for example, numerals 711 through 714 shown in FIG. 3) for latching a multiphase pulse signal by the input signal and outputting a phase information (for example, SEL01 to SEL70 and SEL01B to SEL70B shown in FIG. 3) of a multiphase pulse signal of a closest phase to the latching point; a posterior stage latch circuit (for example, numerals 715, 716 shown in FIG. 3) for latching an output of the anterior stage latch circuit at a single generating point (for example, a first varying point) of an input signal after generation of the activating signal; and a phase control signal generation circuit (for example, numerals 73, 74, 75 shown in FIG. 3) for selectively outputting the channel clock based on an output status of the posterior stage latch circuit and the multiphase pulse signal, and outputting an advance signal or a delay signal in accordance with a phase difference between the input signal and the channel clock based on variation of an output status of the anterior stage latch circuit in response to the output status of the posterior stage latch circuit.

In the phase difference detecting circuit according to the invention the anterior stage latch circuit may include a first anterior stage latch circuit (for example, numerals 711, 713 shown in FIG. 3) for latching a multiphase signal at a front edge of the input signal and a second anterior stage latch circuit (for example, numerals 712, 714 shown in FIG. 3) for latching the multiphase pulse signal at a rear edge of the input signal, and the posterior stage latch circuit may include a first posterior stage latch circuit (for example, numeral 715 shown in FIG. 3) for latching an output of the first anterior stage latch circuit at a rear edge of the first input signal after generation of the activating signal and a second posterior stage latch circuit (for example, numeral 716 shown in FIG. 3) for latching an output of the second anterior stage latch circuit at a front edge of the second input signal (a third varying point) after generation of the activating signal; and the phase difference detecting circuit may further comprise an edge selection circuit (for example, numeral 72 shown in FIG. 3) for outputting to the phase control signal generation circuit the output of the first and the second anterior stage latch circuit and the output of the first or the second posterior stage latch circuit latched first after generation of the activating signal.

In the phase difference detecting circuit according to the invention, the phase control signal generation circuit may comprise a clock selection circuit (for example, numeral 73 shown in FIG. 3) for selectively outputting the channel clock based on the output of the first or the second posterior stage latch circuit output by the edge selection circuit and the multiphase pulse signal; an advance/delay detecting circuit (for example, numeral 74 shown in FIG. 3) for generating a plurality of advance signals and delay signals having a pulse width corresponding to a phase difference of the multiphase pulse signal with respect to the channel clock; and an advance/delay output circuit (for example, numeral 75 shown in FIG. 3) for selectively outputting the plurality of either advance signals or delay signals according to an output of the edge selection circuit.

In the phase difference detecting circuit according to the invention, the advance/delay output circuit may comprise a first phase shift width detecting circuit (for example, numeral 752 shown in FIG. 6) for detecting a phase shift width with respect to the channel clock and a first advance/delay decision circuit (for example, numeral 754 shown in FIG. 6) for deciding whether the phase shift is an advance or a delay, to both of which the output of the clock selection circuit corresponding to the output of the first anterior stage latch circuit is to be respectively input; a first advance/delay decision output circuit (for example, numeral 756 shown in FIG. 6) for selecting either an advance signal or a delay signal having a pulse width corresponding to the phase shift out of the plurality of advance signals or delay signals according to the phase shift width and advance/delay of the phase shift and outputting such advance signal or delay signal as a first advance decision signal or a first delay decision signal; a second phase shift width detecting circuit (for example, numeral 753 shown in FIG. 6) for detecting a phase shift width with respect to the channel clock and a second advance/delay decision circuit (for example, numeral 751 shown in FIG. 6) for deciding whether the phase shift is an advance or a delay, to both of which the output of the clock selection circuit corresponding to the output of the second anterior stage latch circuit is to be respectively input; a second advance/delay decision output circuit (for example, numeral 755 shown in FIG. 6) for selecting either an advance signal or a delay signal having a pulse width corresponding to the phase shift out of the plurality of advance signals or delay signals according to the phase shift width and advance/delay of the phase shift and outputting such advance signal or delay signal as a second advance decision signal or a second delay decision signal; and an output logic circuit (for example, numerals 757 and 759 shown in FIG. 6) for alternately switching and outputting the first advance decision signal or the second advance decision signal and the first delay decision signal or the second delay decision signal respectively as the advance signal and the delay signal, according to a logic status of the input signal.

The input signal is connected to the selection circuit, where it is decided to which phase of the multiphase pulse signal the input signal is the closest. According to the decision, a multiphase pulse signal that is closest to the phase of the input signal is selected as a channel clock (output clock of the PLL). The channel clock remains fixed once it is selected, and a pull-in action for phase locking is performed through comparison of a phase of the input signal and of the channel clock by the phase comparator. Then the selection circuit generates a skew adjusting signal for adjusting the advance or delay of the channel clock, based on a voltage difference or current difference depending on whether the input signal is advanced or delayed with respect to the channel clock fixed earlier. (FIG. 1)

DESCRIPTION OF THE PREFERRED EMBODIMENTS

Now, an embodiment of a PLL circuit and a phase difference detecting circuit provided with a multiphase controlled oscillator (ICO) for oscillating a multiphase signal according to the present invention will be described in details in the following.

Figure 1:
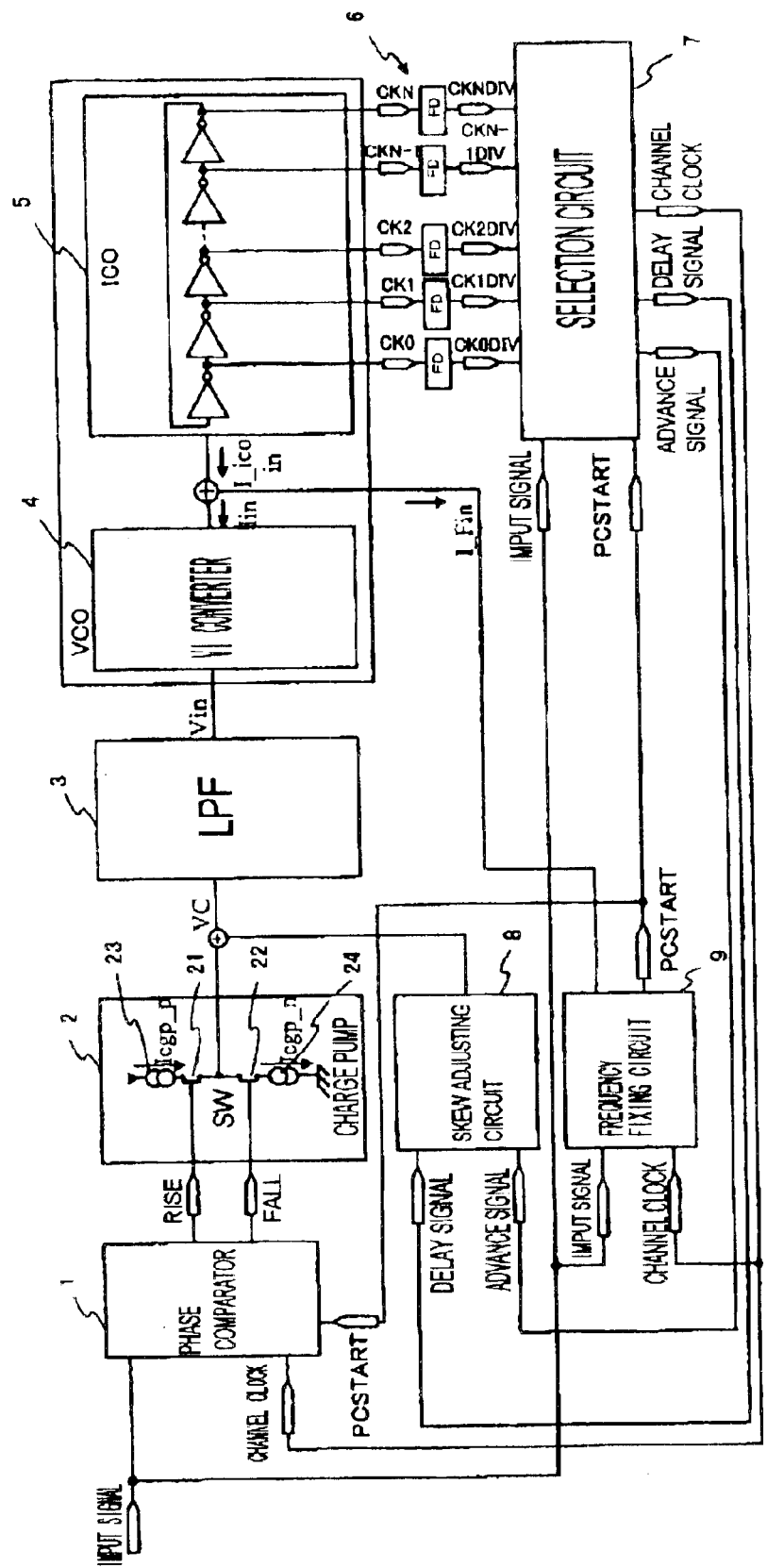
FIG. 1 is a schematic diagram showing an embodiment of a PLL circuit according to the present invention.

FIG. 1 is a schematic diagram showing a constitution of a PLL circuit according to the embodiment of the present invention. In this embodiment, the PLL circuit includes a phase comparator 1 for comparing a phase of an input signal such as EFM and a channel clock, a charge pump circuit 2 to be controlled by an output (rising instruction signal and falling instruction signal) of the phase comparator 1, a low-pass filter (LPF filter) 3 for extracting a low frequency signal out of an output of the charge pump circuit 2, a voltage/current converting circuit (VI converter) 4 for converting an output of the LPF filter 3 into a current value, a controlled oscillator (ICO) 5 an oscillating frequency thereof is controlled by an output of the voltage/current converting circuit 4 and in which delay cells for outputting a plurality of multiphase signals are connected in a ring shape, a plurality of frequency-dividing circuits 6 for outputting a plurality of multiphase signals generated by respectively frequency-dividing the plurality of outputs of the controlled oscillator 5 and sequentially delayed by a predetermined delay (1 delay), a selection circuit 7 to which the input signal, outputs of the plurality of frequency-dividing circuits 6 and a PCSTART signal for controlling an activation of synchronization are to be input for outputting as a channel clock an output selected out of the outputs of the plurality of frequency-dividing circuit 6 and also for outputting an advance signal and a delay signal serving as a control signal for adjusting a skew of the channel clock with respect to the input signal, a skew adjusting circuit 8 for adjusting the skew by inputting the advance signal and the delay signal and by controlling an output of the charge pump circuit 2, and a frequency fixing circuit 9 to which the input signal and the channel clock are to be input, for outputting to the phase comparator 1 the PCSTART signal that activates the PLL operation when the input signal enters into a capture range of the PLL circuit. Constitutions and functions of the respective components are described below.

The frequency fixing circuit 9 adds, during an initial operation prior to its main operation, a control current I_Fin to output current Iin of the voltage/current converting circuit 4 so that a frequency of the input signal and of the channel clock becomes equal and adjusts input current I_icoin of the controlled oscillator (ICO), which is controllable by current. The frequency fixing circuit 9 outputs the PCSTART signal (from a low level toward a high level) to activate the phase comparator 1 once the frequency of the channel clock enters into a capture range of the phase comparator 1, and maintains the control current I_Fin after outputting a PCSTART signal at a high level. The phase comparator 1 is activated by the PCSTART signal output from the frequency fixing circuit 9, and compares a phase of the input signal and of the channel clock output by the controlled oscillator (ICO) 5, for outputting an rising instruction signal or falling instruction signal, to be generated according to a phase difference. The charge pump circuit 2 is provided with switches 21 and 22 controlled respectively by the rising instruction signal and falling instruction signal output by the phase comparator 1 and current sources 23 and 24 connected in series with the respective switches 21 and 22, and outputs a current from either of the current sources 23 or 24 depending on an ON/OFF status of the respective switches. The LPF filter 3 receives an input of a summed value of an output current of the charge pump circuit 2 and an output current of the skew adjusting circuit 8, and outputs a low frequency component signal extracted from the summed current. The voltage/current converting circuit 4 receives an input of the low frequency component signal to convert it into a current signal.

The controlled oscillator (ICO) 5 is provided with delay cells that produce a propagating delay between an input and an output such as inverter circuits or inverting amplifiers connected in a ring shape, and oscillates a plurality of multiphase signals of different phases from each delay cell. The controlled oscillator (ICO) 5 is capable of controlling the oscillating frequency by adjusting a current source etc. for the delay cells, to which an output of the voltage/current converting circuit 4 is supplied as the source current, and has a function to vary the oscillating frequency in accordance with the output current of the voltage/current converting circuit 4. The frequency dividing circuit 6 serves to frequency divide by a predetermined frequency dividing ratio each of the multiphase signals output from each of the delay cell stages included in the controlled oscillator, and to output such signals as multiphase pulse signals. By the way, the frequency dividing circuit 6 may be omitted and substituted by a circuit having an output stage function incorporated in the controlled oscillator 5 for outputting multiphase signals.

The skew adjusting circuit 8 inputs the advance signal and the delay signal and outputs a current signal for controlling a skew to an output side of the charge pump circuit 2.

Figure 2:
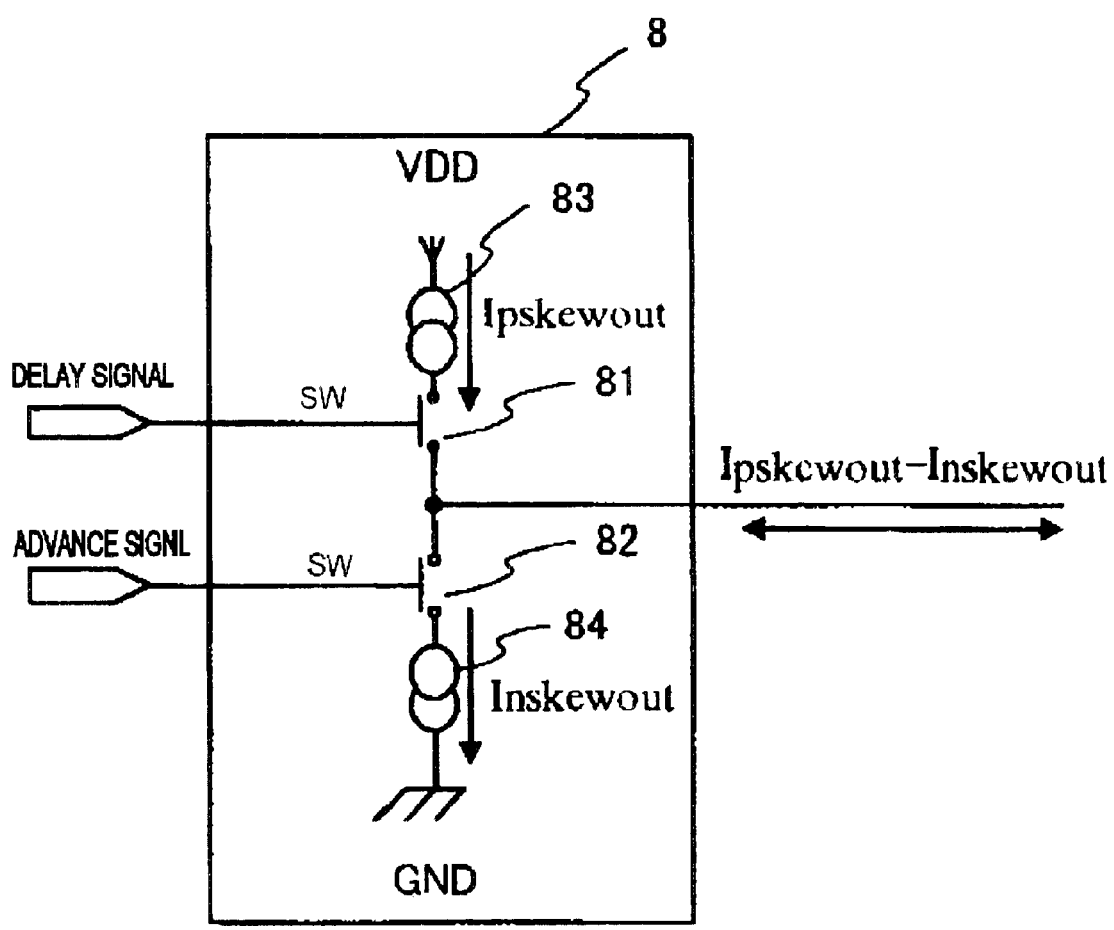
FIG. 2 is a circuit diagram of a skew adjusting circuit according to the present invention.

FIG. 2 is a circuit diagram showing a configuration of the skew adjusting circuit 8. The skew adjusting circuit 8, similarly to the charge pump circuit 2, is provided with a current source 83 for discharging a current, a current source 84 for taking in a current, and switches 81 and 82 disposed in series between the respective current sources 83 and 84 and an output terminal, to be controlled by the advance signal and the delay signal. The skew adjusting circuit 8 outputs a current corresponding to a difference of the advance signal and the delay signal input thereto, and the output current is added to an output of the charge pump circuit 2 as a correcting signal.

Returning back to FIG. 1, the selection circuit 7 compares the multiphase pulse signals output from the plurality of frequency dividing circuits 6 with a phase of the input signal to select one of the multiphase pulse signals that is the closest to a phase of the input signal received immediately after a high level input of the PCSTART signal and to output such multiphase pulse signal in a fixed state as the channel clock, and also constantly detects a phase difference between the channel clock and the input signal, thus to output an advance signal and a delay signal corresponding to the phase difference.

Now referring to FIGS. 3 to 12, the selection circuit 7 which has the functions of channel clock selection and phase comparison for skew adjustment, will be explained in more details.

Figure 3:
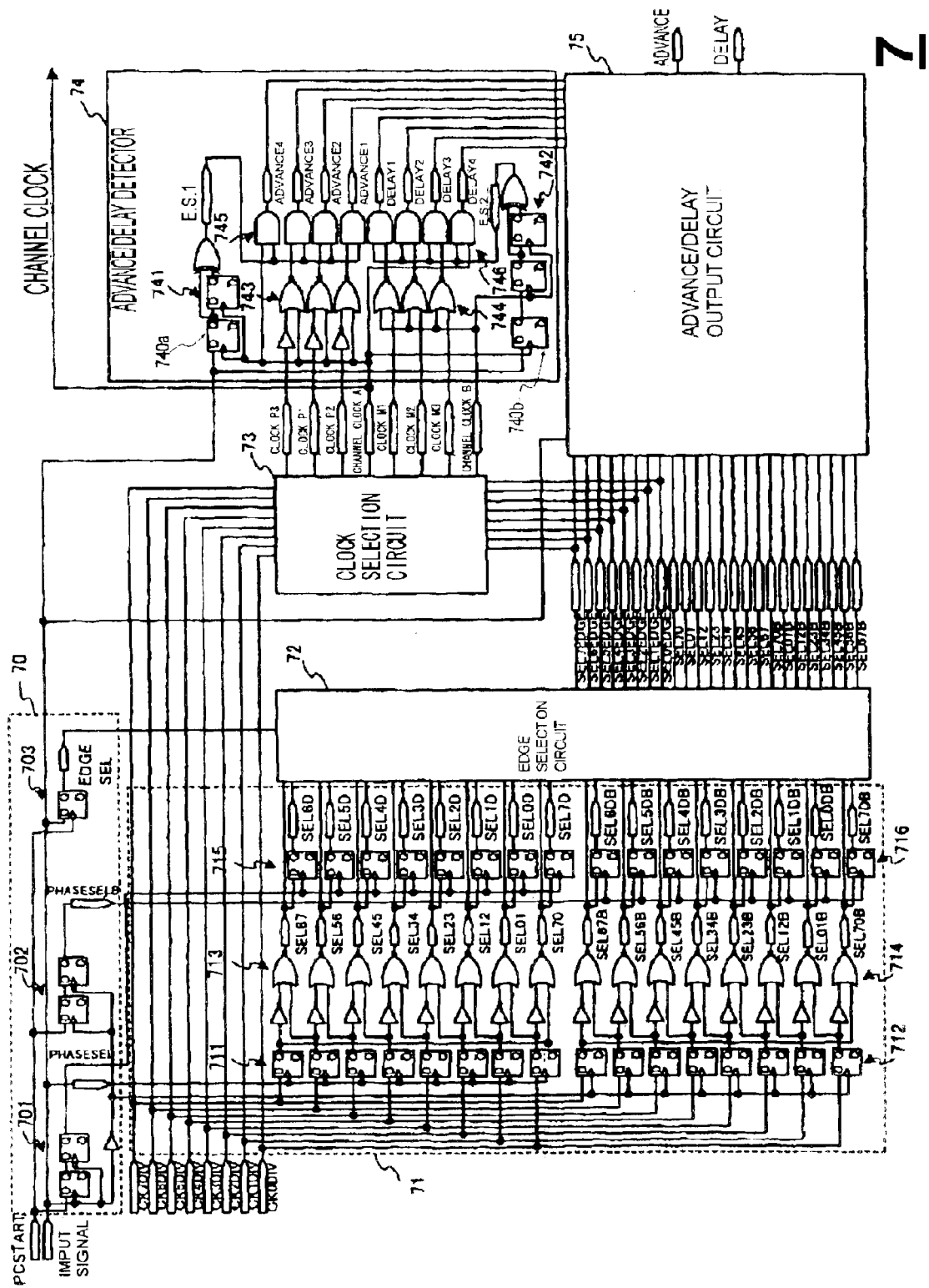
FIG. 3 is a circuit diagram showing a configuration of a selection circuit according to the present invention.
Figure 11:
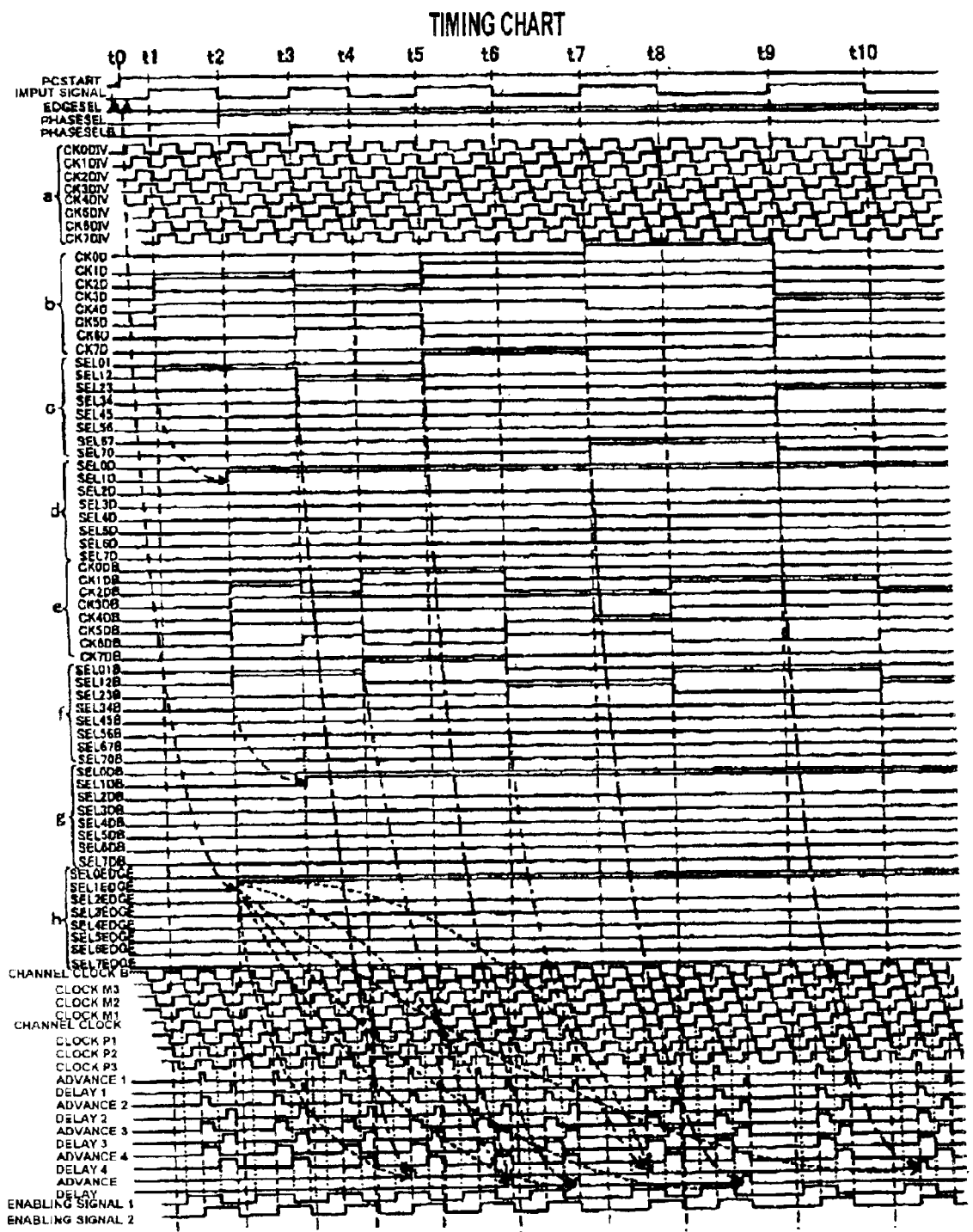
FIG. 11 is a timing chart of an operation of the selection circuit according to the present invention.
Figure 12:
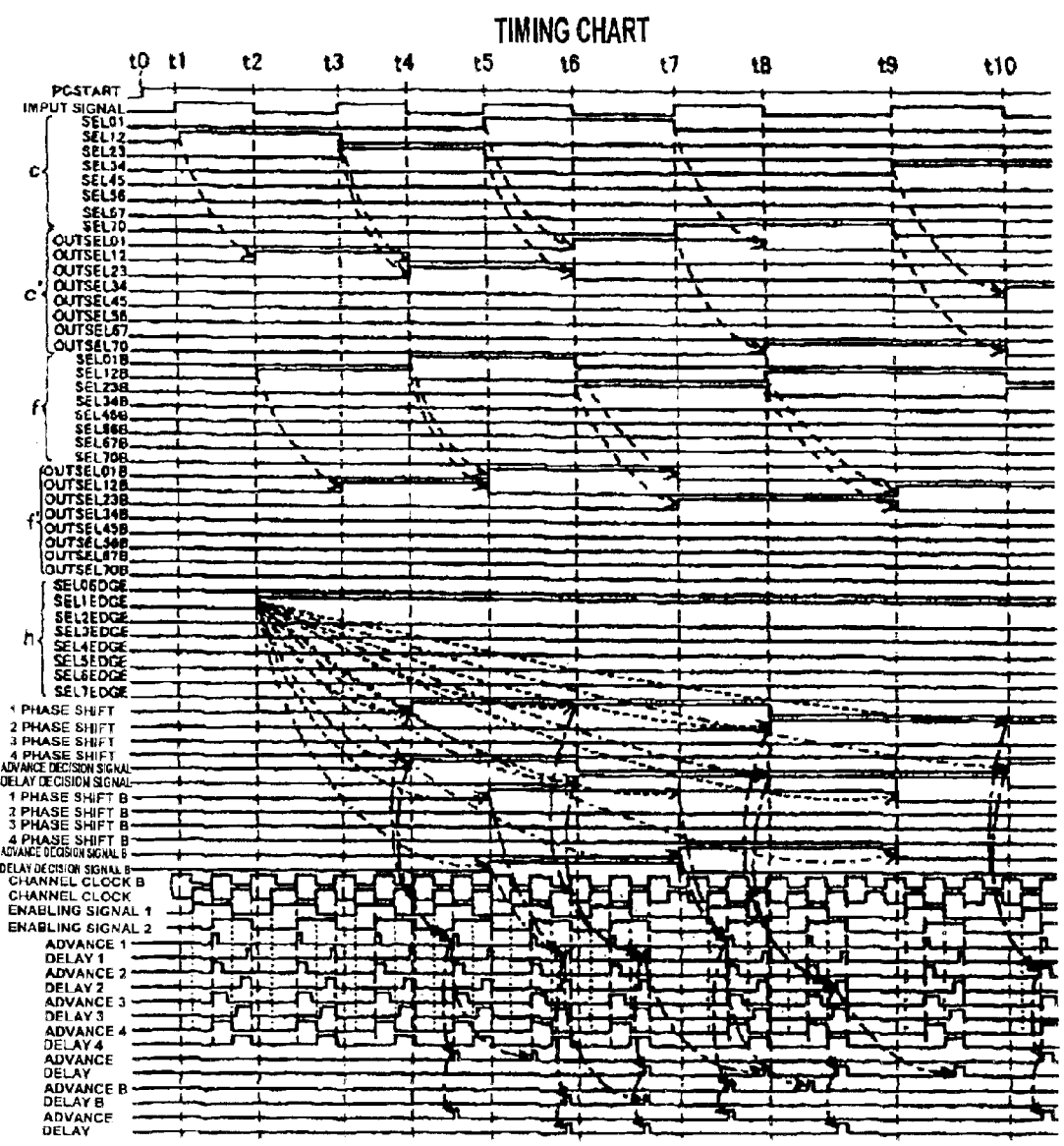
FIG. 12 is a timing chart of an operation of the advance/delay output circuit according to the present invention.
Figure 13:
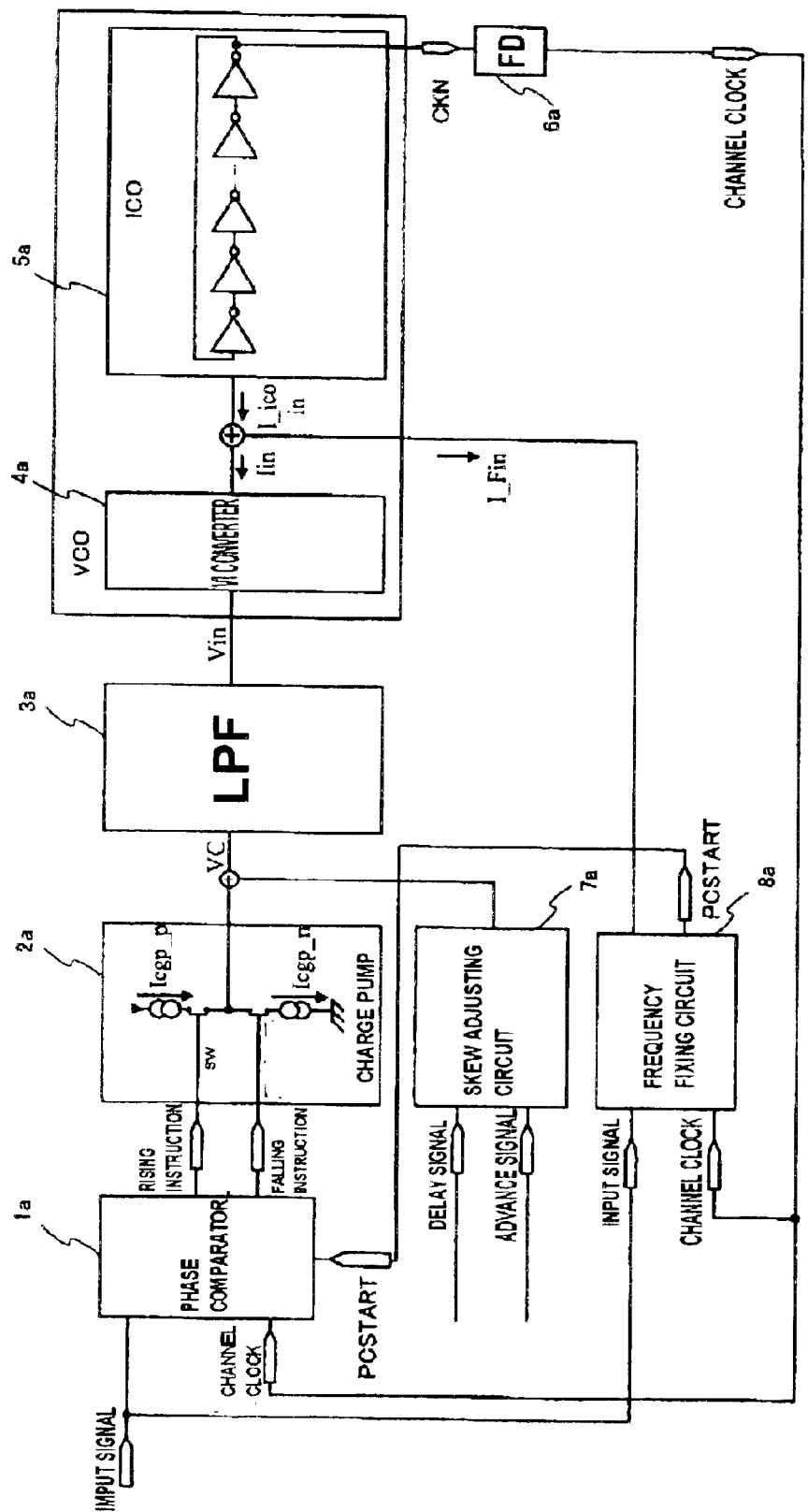
FIG. 13 is a schematic diagram showing a constitution of a conventional PLL circuit.

FIG. 3 is a circuit diagram showing a configuration of a selection circuit according to the embodiment, and FIGS. 11 and 12 are timing charts of an operation of the same selection circuit. These charts show an operation wherein the PCSTART signal is activated at a point of "t0" in a low level stage of the input signal. Hereinafter, operation of each part of the selection circuit will be described referring also to the timing charts shown in FIGS. 11 and 12.

The selection circuit 7 is provided with an input section 70 for inputting the input signal and the PCSTART signal, a latch circuit 71 constituted of a D-type flip-flop circuit for detecting to which phase of the multiphase pulse signals the input signal is the closest, an edge selection circuit 72 for selectively outputting an output of the latch circuit 71 so that an operation immediately starts at an edge of the input signal received upon activation of the PCSTART to a high level, a clock selection circuit 73 for selecting a multiphase pulse signal having the closest phase with respect to the edge of the input signal thus to output a channel clock etc., an advance/delay detecting circuit or advance/delay detector 74 for outputting control signals having a plurality of pulse width to control an advance or a delay (skew) of the controlled oscillator 5, and an advance/delay output circuit 75 for outputting an advance signal or a delay signal for performing feedback control of advance and delay of the controlled oscillator.

Operation of the individual circuits incorporated in the selection circuit 7 shown in FIG. 3 will now be described. The input section 70 is provided with a first to third delay circuits 701 to 703, to which the input signal and the PCSTART signal that serves as an activating signal (starting signal) for a PLL action at its rising edge to a high level are to be input. The first delay circuit 701, to a D terminal thereof the PCSTART signal is input and to a clock terminal thereof the input signal is input, is of a shift register type constituted of two D-type flip-flop circuits in which a Q output terminal and the D terminal are connected in series. The second delay circuit 702, to a D terminal thereof the PCSTART signal is input and to a clock terminal thereof the inverted input signal is input, is of a shift register type constituted of a D-type flip-flop circuit in which a Q output terminal and the D terminal are connected in series. The third delay circuit 703 is constituted of a single D-type flip-flop circuit wherein the PCSTART signal is input to a clock terminal and the input signal is input to a D terminal.

The first delay circuit 701 delays a starting signal by a high level width of a pulse of the input signal by shifting the starting signal in turn according to a rise and a fall of the input signal, and outputs a signal PHASESEL shown in FIG. 11. Likewise, the second delay circuit 102 delays a starting signal by a low level width of a pulse of the input signal by shifting the starting signal in turn according to a rise and a fall of the input signal, and outputs a signal PHASESELB shown in FIG. 11. The third delay circuit 703 latches the input signal at a rising edge of the starting signal so as to latch a logic status (high level or low level) of the input signal at a rising edge of the starting signal, and outputs a signal EDGESEL.

The latch circuit 71 is provided with a first anterior stage latch circuit 711, a second anterior stage latch circuit 712, a plurality of first logic circuits 713, a plurality of second logic circuit 714, a first posterior stage latch circuit 715, and a second posterior stage latch circuit 716. The first anterior stage latch circuit 711 includes an equivalent number of D-type flip-flop circuits to that of phases of a plurality of multiphase pulse signals, to a clock terminal thereof the input signal is input and to a D terminal thereof each of the multiphase pulse signals CK0DIV to CK7DIV is input. The second anterior stage latch circuit 712 includes the equivalent number of D-type flip-flop circuits each of which having a similar constitution to those in the first anterior stage latch circuit 711 but to a clock terminal thereof an inverted input signal is input. The plurality of first logic circuits 713 are associated with a Q output of the first anterior stage latch circuit 711, to a NAND circuit thereof an output inverted by an inverting circuit of the Q output according to a phase sequence of the multiphase pulse signals and a Q output of an adjacently preceding D-type flip-flop circuit are input in the same phase sequence for outputting phase detecting signals SEL01 to SEL70 each containing information on phase relation between the input signal and the multiphase pulse signal. The plurality of second logic circuit 714, each of which having a similar constitution to that of the first logic circuit 13, are associated with an output of the second anterior stage latch circuit 712. The first posterior stage latch circuit 715 includes D-type flip-flop circuits, to a D terminal thereof an output of the first anterior stage logic circuit 713 is input and to a clock terminal thereof an output of the first delay circuit 701 is input. The second posterior stage latch circuit 716, having a same constitution to the first posterior stage latch circuit 715, includes D-type flip-flop circuits associated with an output of the plurality of second logic circuit 714 and to a clock terminal thereof an output of the second anterior stage delay circuit 702 is input.

In the latch circuit 71, the first anterior stage latch circuit 711 latches a logic status of the multiphase pulse signals at their respective rising edges to a high level (pulse front edges t1, t3, t5, etc.) of the input signal and outputs signals CK0D to CK7D shown in FIG. 11. The second anterior stage latch circuit 712 latches a logic status of the multiphase pulse signals at their respective falling edges to a low level (pulse rear edges t2, t4, t6, etc.) of the input signal and outputs signals CK0DB to CK7DB shown in FIG. 11. A half of the respective outputs of the plurality of D-type flip-flop circuits in each latch circuit (signals CK0D to CK7D and CK0DB to CK7DB) is of a high level and the other half is of a low level as the signals CK0D to CK7D shown in FIG. 11, since the multiphase consists of an even number of phases. The first logic circuit 713 outputs a high level signal from a NAND circuit connected through an inverting circuit with an output of a D-type flip-flop circuit that first outputs a high level signal in a phase sequence of the multiphase pulse signals among the signals CK0D to CK7D and CK0DB to CK7DB, while in the first posterior stage latch circuit 715 only those D-type flip-flop circuits connected with the NAND circuit that outputs a high level signal latch and output the high level signal at the front edges (t1, t3, t5, etc.) In the second posterior stage latch circuit 716, only those D-type flip-flop circuits connected with the NAND circuit that outputs a high level signal latch and output the high level signal at the rear edges (t2, t4, t6, etc.).

Now, constitution and operation of the edge selection circuit 72 will be described referring to FIG. 4.

Figure 4:
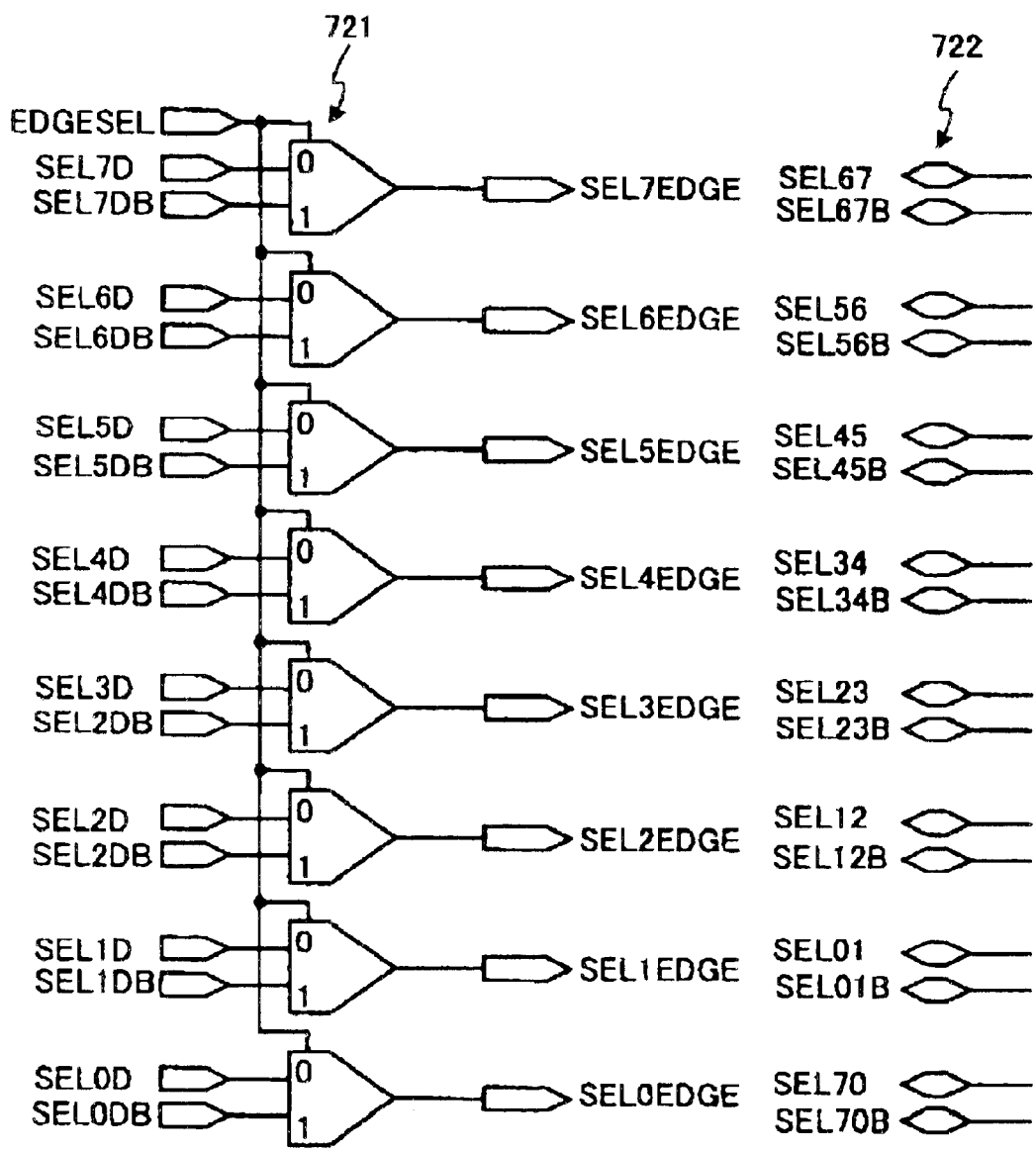
FIG. 4 is a circuit diagram showing a specific configuration of an edge selection circuit according to the present invention.

FIG. 4 is a circuit diagram showing a specific configuration of the edge selection circuit 72. The edge selection circuit 72 is provided with a switching circuit 721 and a connecting terminal 722 disposed between the input and output for connection, and the switching circuit 721 switches between two inputs consisting of the plurality of outputs from the first posterior stage latch circuit 715 and from the second posterior stage latch circuit 716 respectively coupled in a phase sequence under a control of the EDGESEL signals output from the third delay circuit 703, and outputs signals SEL0EDGE to SEL7EDGE to a succeeding circuit. Also, the outputs SEL70 to SEL67 from the first logic circuit 713 and SEL70B to SEL67B from the second logic circuit 714 are output to a succeeding circuit through the connecting terminal 722.

Because of such constitution, the edge selection circuit 72 serves to select and output one of the outputs SEL0D to SEL7D from the first posterior stage latch circuit 715 or SEL0DB to SEL7DB from the second posterior stage latch circuit 716, respectively latched at an edge of the input signal immediately after a rising of the PCSTART signal. When the input signal is at a low level at the time of rising of the PCSTART signal, an output from the first posterior stage latch circuit 715 is selected, while when the input signal is at a high level at that time, an output from the second posterior stage latch circuit 716 is selected. FIG. 11 shows an example wherein the outputs SEL0D to SEL7D from the first posterior stage latch circuit 715 are selected and output to a succeeding circuit.

Then, constitution and operation of the clock selection circuit 73 will be described referring to FIG. 5.

Figure 5:
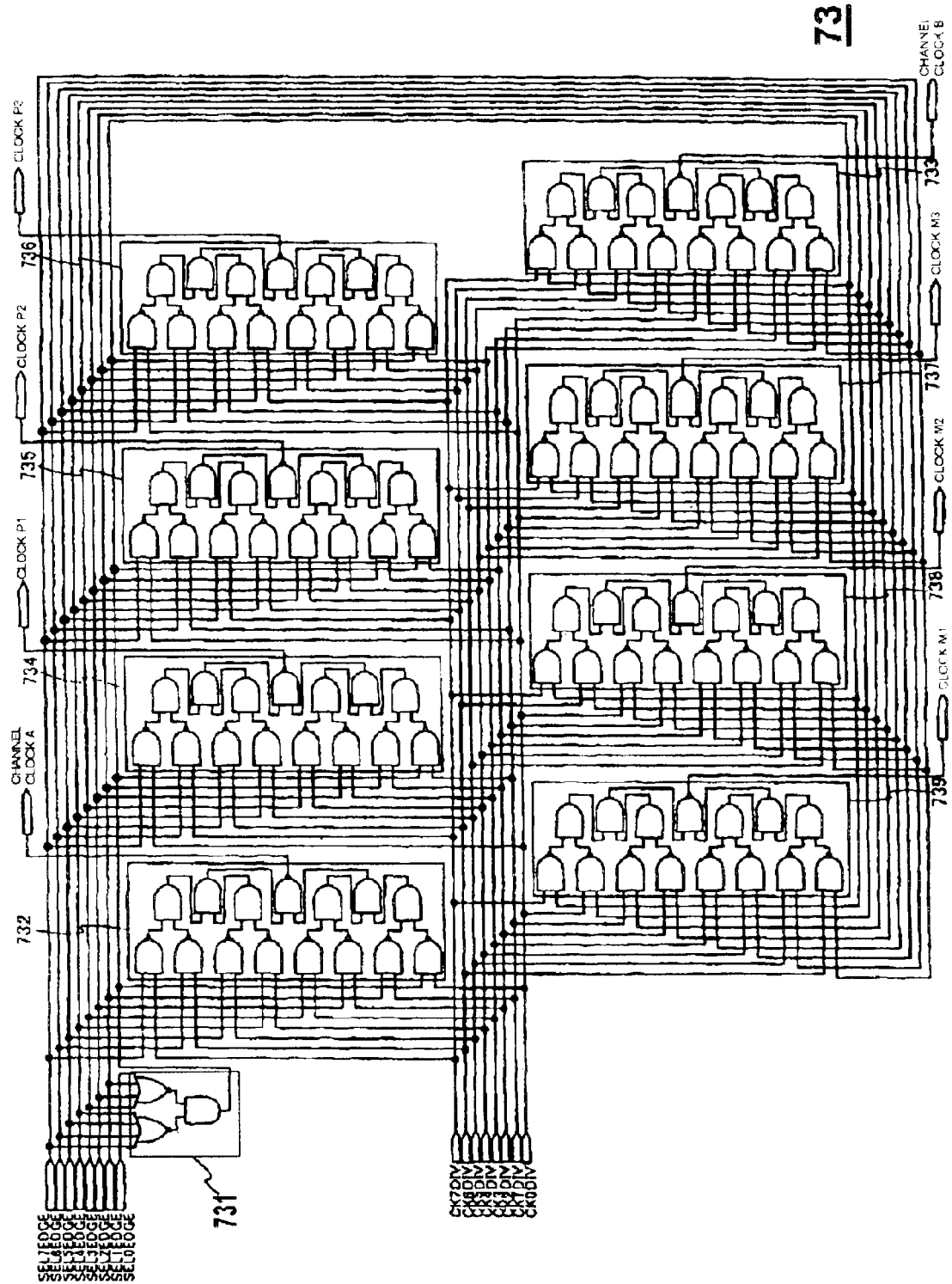
FIG. 5 is a circuit diagram showing a specific configuration of a clock selection circuit.

FIG. 5 is a circuit diagram showing a specific configuration of the clock selection circuit 73. The clock selection circuit 73, to which the output signals SEL0EDGE to SEL7EDGE from the edge selection circuit 72 and multiphase pulse signals CK0DIV to CK7DIV are input, is provided with a logic circuit 731 and a channel clock generation circuit 732. The logic circuit 731 outputs a high level signal instead of the signal SEL0EDGE only when all the outputs SEL1EDGE to SEL7EDGE are of a low level. The channel clock generation circuit 732 includes eight NAND circuits to each of which two signals consisting of the output signal of the logic circuit 731 and signals SEL1EDGE to SEL7EDGE, and one of the multiphase pulse signals CK0DIV to CK7DIV sequentially coupled are input, four first AND circuits to each of which outputs from respective two adjacent NAND circuits are input, tow second AND circuits to each of which outputs from respective two first AND circuits are input, and a third AND circuit to which outputs from respective two second AND circuits are input. Eventually, the third AND circuit outputs a channel clock A. The clock selection circuit 73 is provided also with a clock P1 generation circuit 734, a clock P2 generation circuit 735, a clock P3 generation circuit 736, a channel clock B generation circuit 733, a clock M3 generation circuit 737, a clock M2 generation circuit 738 and a clock M1 generation circuit 739 each having a similar constitution to the channel clock generation circuit 732, to each of which the multiphase pulse signals CK0DIV to CK7DIV out of the signal couples input to the eight NAND circuits sequentially shifted by one are respectively input, for respectively outputting signals sequentially delayed by one delay with respect to the channel clock, namely the signals clock P1, clock P2, clock P3, channel clock B, clock M3, clock M2 and clock M1.

As a result of such constitution, in the clock selection circuit 73, one of the signals SEL1EDGE to SEL7EDGE is raised to a high level because of the output of the logic circuit 731. Under such high level state, the clock selection circuit 73 selects one of the multiphase pulse signals CK0DIV to CK7DIV that rises at a closest position to a rising timing of the input signal and outputs either the channel clock A or channel clock B, which are of the opposite phase mutually, from the channel clock generation circuit 732 or channel clock B generation circuit 733, respectively. The clock selection circuit 73 also outputs the clock P1 to clock P3 signals and clock M1 to clock M3 signals, each of a phase shifted by one delay from the channel clock A and the channel clock B respectively, from the remaining generation circuits 734, 735 and 736, and 737, 738 and 739.

Now referring back to FIG. 3, the advance/delay detector 74 in the selection circuit 7 will be described in detail hereinafter.

The advance/delay detector 74 is provided with a fourth delay circuit 740a of a shift register constitution having two D-type flip-flop circuits connected in series, to a D terminal of a first stage D-type flip-flop circuit thereof the input signal is input and to a clock terminal thereof a channel clock A is input; an input signal enabling circuit (1) 741 which includes an exclusive OR circuit for an input/output of a second stage D-type flip-flop circuit of the fourth delay circuit 740a, for outputting an input signal enabling signal 1 from the exclusive OR circuit; a fifth delay circuit 740b of a shift register constitution having a D-type flip-flop circuit to a D terminal thereof the input signal is input and to a clock terminal thereof a channel clock A is input, and two D-type flip-flop circuits to a D terminal of a first stage D-type flip-flop circuit thereof an output of the preceding D-type flip-flop circuit is input and to a clock terminal thereof a channel clock B is input, all these D-type flip-flop circuits being connected in series; an input enabling circuit (2) 742 which includes an exclusive OR circuit for an input/output of the second (output side) D-type flip-flop circuit of the fifth delay circuit, for outputting an input signal enabling signal 2 from the exclusive OR circuit; NAND circuits 743 to which the channel clock A and inverted outputs of the clock P1 to clock P3 signals are respectively input; NOR circuits 744 to which the channel clock B and clock M1 to clock M3 signals are respectively input; AND circuits 745 to a terminal thereof the respective outputs of the channel clock A and NAND circuits 743 are input and to another terminal thereof an output of the input signal enabling circuit (1) 741 is input; and NAND circuits 746 to a terminal thereof the channel clock A and outputs from the NOR circuits 744 are respectively input and to another terminal thereof an output of the input signal enabling circuit (2) 742 is input.

In the advance/delay detector 74, the input signal enabling circuit (1) 741 serves to output, as shown in FIG. 11, a high level portion of the input signal as input enabling signal 1 having a cycle of the channel clock A, through the exclusive OR operation of a signal generated by synchronizing the input signal with each rising of the channel clock A and a signal generated by synchronizing the above signal at each rising point of the channel clock A (delaying by one cycle of the channel clock A). The input signal enabling circuit (2) 742 performs through the channel clock B which is of an opposite phase to the channel clock A, a similar OR operation with a signal generated by the first D-type flip-flop circuit by delaying the input signal by one cycle of the channel clock A, and consequently serves to output an input enabling signal 2 having a phase shifted (delayed) by 90 degrees with respect to the input enabling signal 1 as shown in FIG. 11. Also, the NAND circuits 743 respectively output signals of a pulse width equivalent to an interval from a rear edge of the channel clock A to that of the clock P1 to clock P3 signals through NAND operation of the channel clock A and inverted signals of the clock P1 to clock P3 signals, and the NOR circuits 744 respectively output signals of a pulse width equivalent to an interval from a rear edge of the clock M1 to clock M3 signals to a front edge of the channel clock B through NAND operation of the channel clock B and the clock M1 to clock M3 signals. Further, since the outputs from the NAND circuits 743 are output by the AND circuits during only a high level period of the input enabling signal 1 and outputs of the NAND circuits 744 are output by the AND circuits 746 during only a high level period of the input enabling signal 2, the AND circuits 745 output advance 1, advance 2, advance 3 and advance 4 signals, having a pulse width equivalent to time width×1, time width×2, time width×3 and time width×4 respectively, based on a time width corresponding to one delay of a multiphase pulse signal, while the AND circuits 746 output delay 1, delay 2, delay 3 and delay 4 signals, having a pulse width equivalent to time width×1, time width×2, time width×3 and time width×4 respectively, based on the same time width, as shown in FIG. 11. In this case, an advance signal and a delay signal of an equivalent pulse width do not chronologically overlap even partially when being output, as shown in FIGS. 11 and 12. These totally eight advance and delay signals are to be selectively output to the skew adjusting circuit depending on an extent of a phase shift (skew) of an output of the controlled oscillator in the advance/delay output circuit 75 to be described in the following paragraph.

Then, the advance/delay output circuit 75 shown in FIG. 3 will be described in detail.

Figure 6:
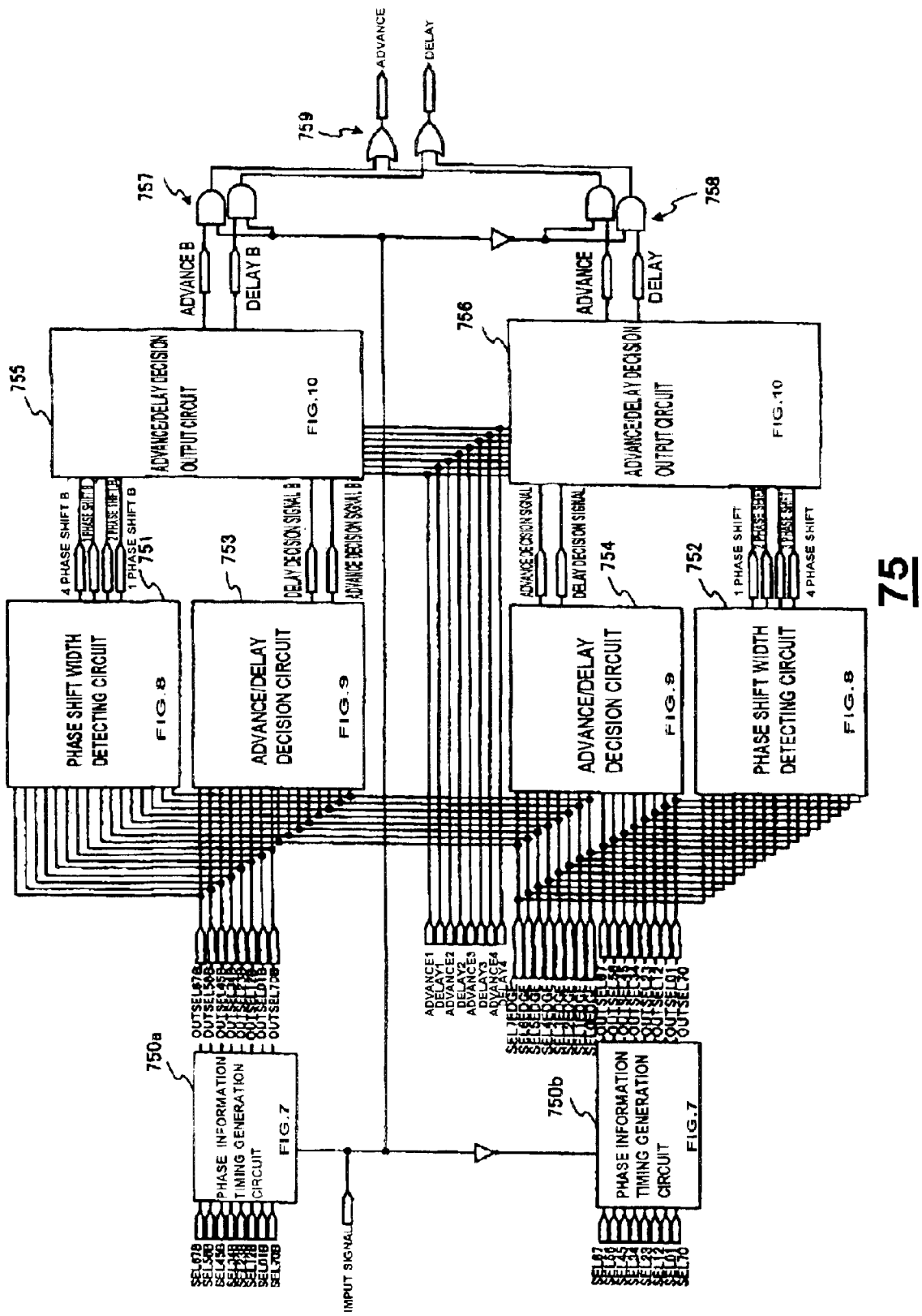
FIG. 6 is a circuit diagram showing a configuration of an advance/delay output circuit.

FIG. 6 is a circuit diagram showing a configuration of the advance/delay output circuit 75. The advance/delay output circuit 75 is provided with phase information timing generation circuits 750a and 750b (see also FIG. 7), phase shift width detecting circuits 751 and 752 (see also FIG. 8), advance/delay decision circuits 753 and 754 (see also FIG. 9), advance/delay decision output circuits 755 and 756 (see also FIG. 10), and logic circuits which include AND circuits 757 and 758 and OR circuits 759 on the output side of the advance/delay decision output circuits 755 and 756. As is apparent in FIG. 6, the advance/delay output circuit 75 includes two similar circuit arrangements constituting an upper section and a lower section respectively. Hereinafter, constitution and operation of the respective circuits will be described in turn.

FIG. 12 is a timing chart of the advance/delay output circuit 75. The respective circuits of the advance/delay output circuit 75 will be described referring also to FIG. 12.

Figure 7:
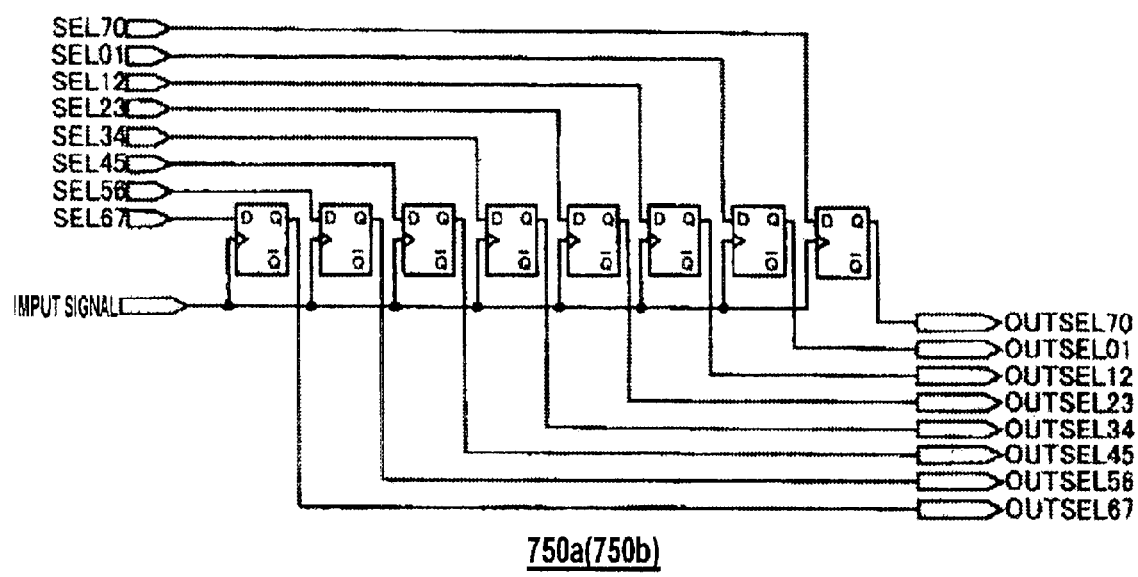
FIG. 7 is a circuit diagram showing a configuration of a phase information timing generation circuit.

FIG. 7 is a circuit diagram showing a configuration of the phase information timing generation circuits 750a and 750b shown in FIG. 6. To the phase information timing generation circuits 750a and 750b, the output signals SEL70, SEL 01, SEL 12, SEL 23, SEL 34, SEL 45, SEL 56, and SEL 67 from the first logic circuit 713 (or output signals SEL70B to SEL67B from the second logic circuit 714) and the input signal are to be input. The phase information timing generation circuits 750a and 750b include a plurality of D-type flip-flop circuits to a D terminal thereof each of the outputs of the first (or second) logic circuit is input and to a clock terminal thereof the input signal is input. As shown in FIG. 12, the phase information timing generation circuit 750a (750b) serves to output signals OUTSEL70 to OUTSEL67 (or OUTSEL70B to OUTSEL67B) that are delayed by one cycle of the input signal from the outputs SEL70 to SEL67 (or SEL70B to SEL67B) from the first (or second) logic circuit. An objective of such function according to this embodiment is a phase adjustment that enables an operation of detecting a phase shift of a selected channel clock at each edge (front edge or rear edge) of the input signal and outputting an advance/delay signal one cycle later for skew adjustment, as will be described later. In other words, a generation timing of the output signals of the third and fourth latch circuits 715 and 716 and a generation timing of the output signals of the first and second anterior stage latch circuits 711 and 712, which serve as the basis for a skew (phase shift) decision, are matched.

Figure 8:
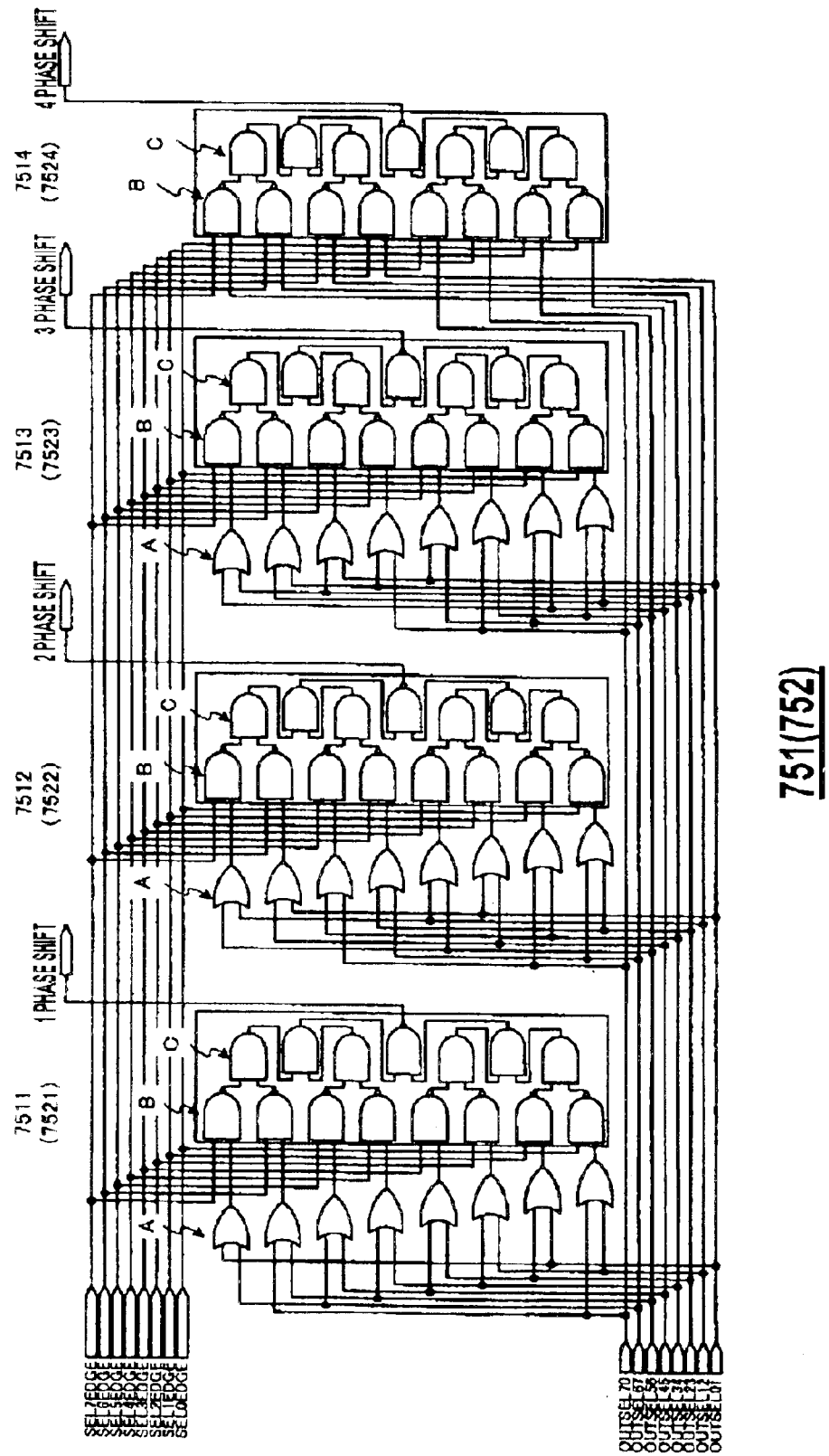
FIG. 8 is a circuit diagram showing a configuration of a phase shift width detecting circuit.

FIG. 8 is a circuit diagram showing a configuration of phase shift width detecting circuits 751 and 752 shown in FIG. 6.

The phase shift width detecting circuits 751 and 752, to each of which the output signals OUTSEL70 to OUTSEL67 (or OUTSEL70B to OUTSEL67B) from the phase information timing generation circuit 750a (or 750b) shown in FIG. 7 and the output signals SEL0EDGE to SEL7EDGE from the edge selection circuit 72 are input, are respectively provided with four logic circuits 7511 (7521), 7512 (7522), 7513 (7523) and 7514 (7524), which include a plurality of NAND circuits B to a terminal thereof each of the signals SEL0EDGE to SEL7EDGE is input and to another terminal thereof an output summed by an OR circuit A containing two of the signals SEL0EDGE to SEL7EDGE having an advance/delay of one delay, advance/delay of two delays, advance/delay of three delays and advance/delay of four delays from each of the signals SEL0EDGE to SEL7EDGE is input, and a logic circuit C having an AND circuit for sequentially producing a logical sum of the outputs of the respective NAND circuits B and a NAND circuit of the final stage, for respectively outputting signals indicating a one phase shift, two phases shift, three phases shift and four phases shift with respect to each of the output signals OUTSEL70 to OUTSEL67 (or OUTSEL70B to OUTSEL67B).

The phase shift width detecting circuit 751 (752) constituted as above detects a shift by one to four delays between a high level of one of output signals SEL0EDGE to SEL7EDGE from the edge selection circuit 72, which is the phase information of the multiphase pulse signal closest to an edge of the input signal detected by latching the multiphase pulse signal at the first rising (or falling) of the input signal, and the phase information subsequently detected at each edge of the input signal, and thereby outputs one of one phase shift, two phases shift, three phases shift or four phases shift signals at a high level. This output is maintained at the high level as far as an edge of the succeeding input signal.

Figure 9:
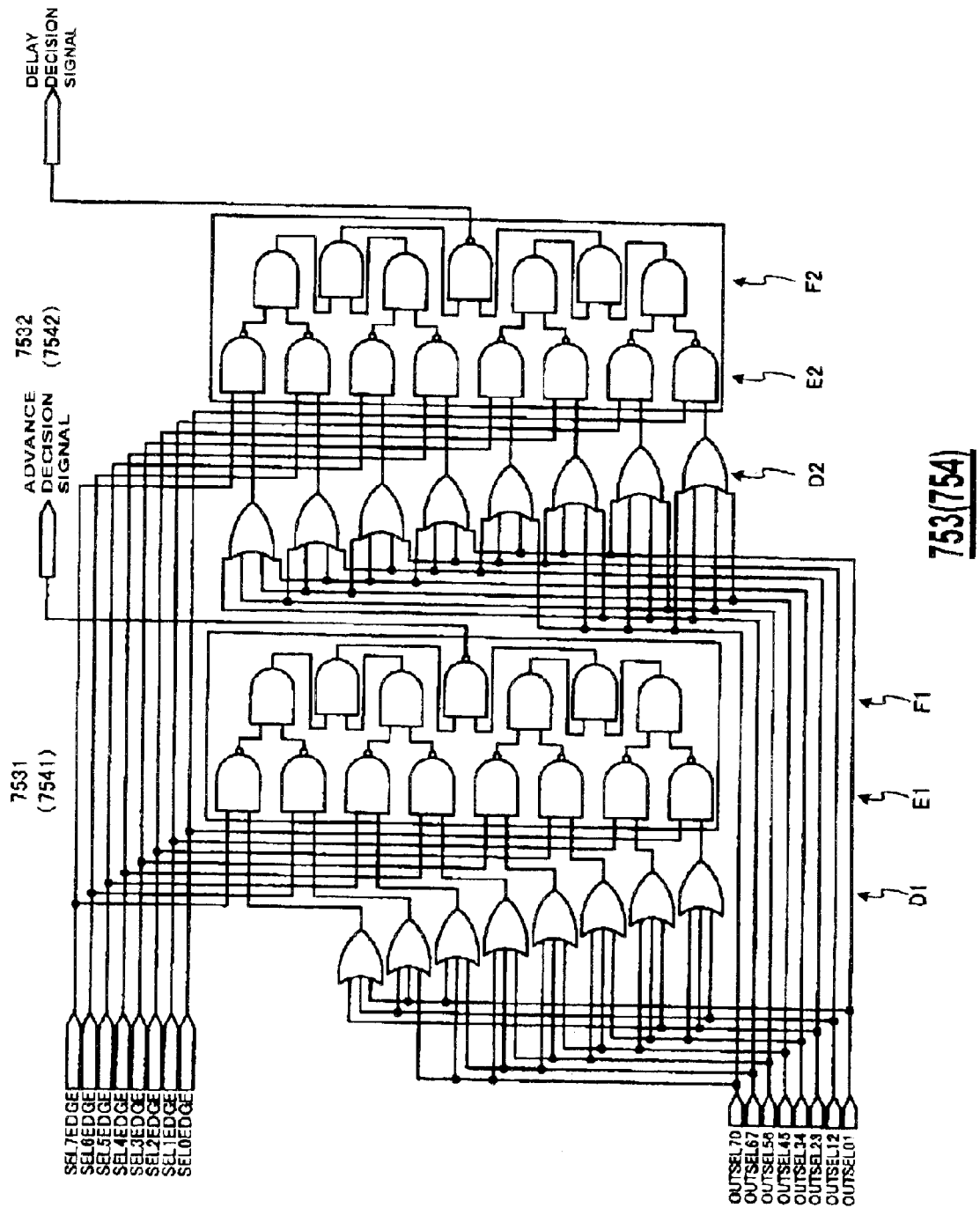
FIG. 9 is a circuit diagram showing a configuration of an advance/delay decision circuit.

FIG. 9 is a circuit diagram showing a configuration of the advance/delay decision circuit 753 (754) shown in FIG. 6.

The advance/delay decision circuit 753 (754), to which the output signals OUTSEL70 to OUTSEL67 (or OUTSEL70B to OUTSEL67B) from the phase information timing generation circuit 750a (or 750b) and SEL0EDGE to SEL7EDGE from the edge selection circuit 72 are input, is provided with an advance decision logic circuit 7531 (or 7541) and a delay decision logic circuit 7532 (or 7542) to a terminal of which each of the signals SEL0EDGE to SEL7EDGE is input.

The advance decision logic circuit 7531 (or 1541) is provided with a plurality of NAND circuits E1 to a terminal thereof each of the signals SEL0EDGE to SEL7EDGE is input and to another terminal thereof an output of an OR circuit D1, which is a logical sum of the three signals OUTSEL 70 to OUTSEL67 (or OUTSEL70B to OUTSEL67B) respectively having an advance of one delay, two delays and three delays from each of the above inputs, is input, and a logic circuit F1 which includes an AND circuit to which two of the outputs from the respective NAND circuits E1 are sequentially input and a NAND circuit to which an output of the final stage AND circuit is input.

The delay decision logic circuit 7532 (or 7542) is provided with a plurality of NAND circuits E2 to a terminal thereof each of the signals SEL0EDGE to SEL7EDGE is input and to another terminal thereof an output of an OR circuit D2, which is a logical sum of the three signals OUTSEL 70 to OUTSEL67 (or OUTSEL70B to OUTSEL67B) respectively having a delay of one delay, two delays and three delays from each of the above inputs, is input, and a logic circuit F2 which includes an AND circuit to which two of the outputs from the respective NAND circuits E2 are sequentially input and a NAND circuit to which an output of the final stage AND circuit is input.

As a result of such configuration, the advance decision logic circuit 7531 (or 7541) and the delay decision logic circuit 7532 (or 7542) serves to output an advance decision signal or a delay decision signal indicating whether a direction of a shift of the signals having a one phase delay to three phases delay output from the phase shift width detecting circuit 751 (or 752) is an advance or a delay.

Figure 10:
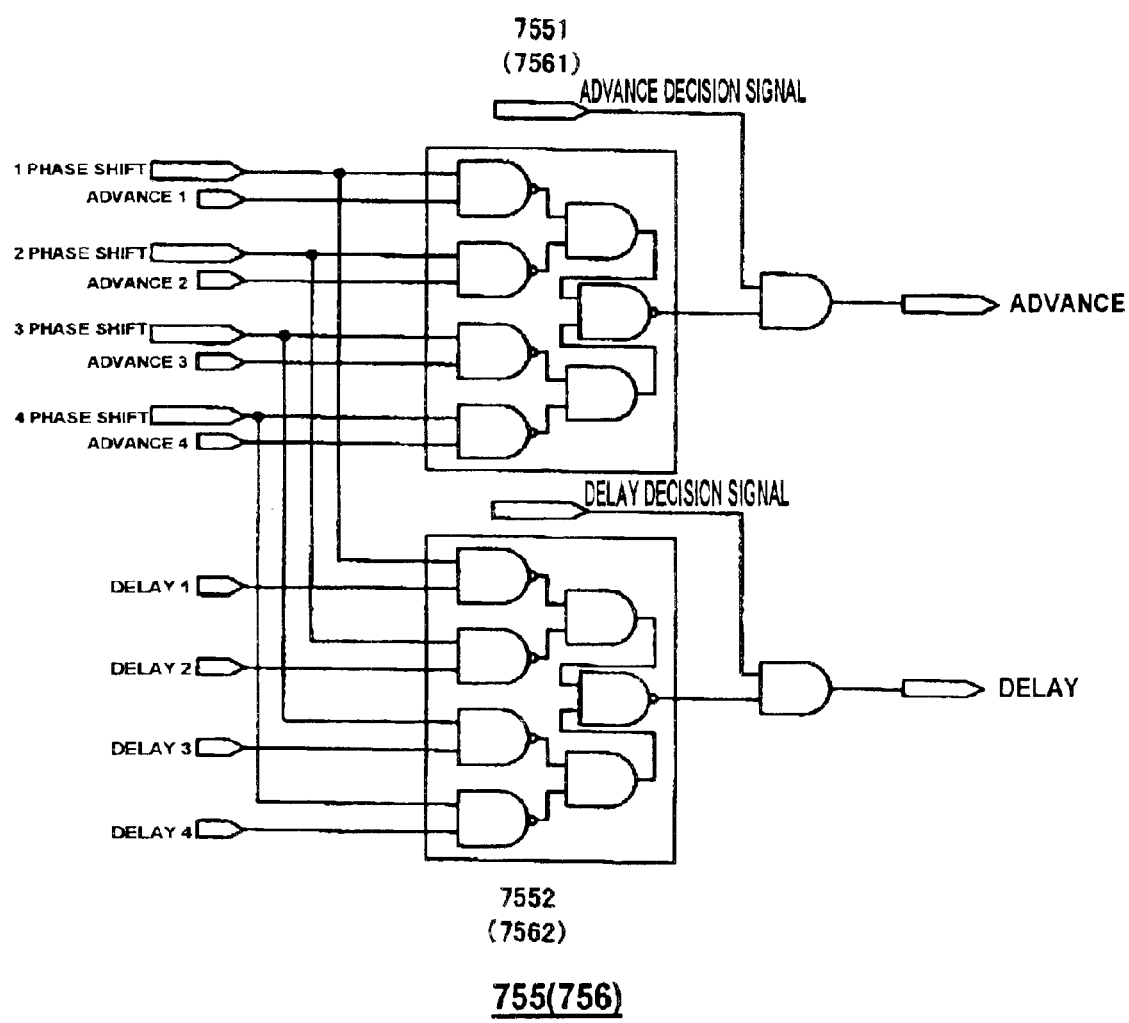
FIG. 10 is a circuit diagram showing a configuration of an advance/delay decision output circuit.

FIG. 10 is a circuit diagram showing a configuration of the advance/delay decision output circuit 755 (756) shown in FIG. 6.

The advance/delay decision output circuit 755 (756) is provided with a first advance/delay decision logic circuit 7551 (7561) which includes four NAND circuits to which each of the signals indicating a one phase shift to a four phases shift and each of the advance signals representing an advance 1 to advance 4 are input, two AND circuits to which two outputs from the preceding NAND circuits are input, and a NAND circuit to which an output of the preceding AND circuit is input; and a second advance/delay decision logic circuit 7552 (7562) similarly including four NAND circuits to which each of the signals indicating a one phase shift to a four phases shift and each of the delay signals representing a delay 1 to delay 4 are input, two AND circuits to which two outputs from the preceding NAND circuits are input, and a NAND circuit to which an output of the preceding AND circuit is input, for outputting through the AND circuit an advance decision output from the first advance/delay decision logic circuit 7551 (7561) and a delay decision output from the second advance/delay decision logic circuit 7552 (7562), as an advance decision output signal and a delay decision output signal, respectively.

The advance decision output signal and delay decision output signal from the advance/delay decision output circuit 755 (756) are respectively input to the two output AND circuits 757 (758), shown in FIG. 6, while to another terminal of the output AND circuits the input signal (inverted input signal) is input. Further, outputs from each of the output AND circuits 757 (758) are respectively input to two output OR circuits 759, to be output as an advance signal or a delay signal to the skew adjusting circuit 8 shown in FIG. 1.

Based on the foregoing constitution and function of the respective components of this embodiment, an overall operation will now be described referring to the input signal and PCSTART signal included in the timing charts shown in FIGS. 11 and 12. Hereinafter, reference codes for signals "a", "b", "c", etc. adopted in the timing charts will be referred to whenever necessary.

In case where the selection circuit 7 is outputting one of the multiphase pulse signals as a channel clock during an initial operation of the PLL circuit shown in FIG. 1, the frequency fixing circuit 9 outputs a current I_Fin corresponding to a frequency difference between an input signal and the channel clock to thereby control an oscillating frequency of the controlled oscillator 5 so that the frequency of the channel clock and that of the input signal become accordant, and besides detects a frequency (phase) of the channel clock that has entered into a capture range of phase comparison characteristics of the phase comparator 1 and outputs a high level of a PCSTART signal (outputs a PCSTART signal) to the phase comparator 1. FIG. 11 shows a case wherein the PCSTART signal is output at t0 point of a low level portion of the input signal. Now, operation of the latch circuit 71 after the PCSTART signal has risen to a high level will be described.

The first anterior stage latch circuit 711 latches multiphase pulse signals "a" at front edges (t1, t3, t5, etc.) of the input signal, and outputs latch output signals "b" after retaining from a front edge of the input signal until the next front edge.

Likewise, the second anterior stage latch circuit 712 latches multiphase pulse signals "a" at rear edges (t2, t4, t6, etc.) of the input signal and outputs latch output signals "e" after retaining from a rear edge of the input signal until the next rear edge. At the t1 point, since the first anterior stage latch circuit 711 latches a high level portion of four continuous signals in a sequence of phases based on the "a" constitution of the multiphase pulse signals and a low level portion of the remaining four signals, therefore, in the signals "b" only the four continuous signals are output at a high level as well. At the t2 point, similarly four adjacent signals in the signals "e" are output at a high level (four continuous high levels).

Latch outputs after the t3 point also latch the multiphase pulse signals of "a" constitution by a similar operation, while a slight phase shift is gradually taking place in a phase of the input signal as from the t1 point, because of which the four continuous high levels of the signals "b" and "e" after the t3 point are not free from a phase shift at a switching point (phase) from a low level to a high level.

The first logic circuit 713 detects an initial phase of the four continuous high levels of the signals "b". In other words, a phase that has turned to a high level from a low level among the eight signals "b" is detected, and eight signals as shown in signals "d", wherein only such signals out of the signals "b" that correspond to the detected phase are of a high level, are output. Specifically, only SEL12 is at a high level after the t1 point, only SEL23 is at a high level after the t3 point, only SEL01 is at a high level after the t5 point, etc.

The second logic circuit 714 also outputs through a similar operation based on the signals "e", eight signals as shown in signals "f", wherein only such signals out of the eight signals "e" that correspond to a phase that has turned to a high level from a low level are of a high level. This outputs starts as from the t2 point, and only SEL12B is at a high level after the t2 point, only SEL01B is at a high level after the t4 point, only SEL23B is at a high level after the t6 point, etc.

The first posterior stage latch circuit 715 and the second posterior stage latch circuit 716 latch only once the eight signals from the first logic circuit 713 and the eight signals from the second logic circuit 714 respectively, after the PCSTART signal has risen to a high level. Specifically, the first posterior stage latch circuit 715 is triggered by an output signal PHASESEL from the first delay circuit 701 output at the t2 point, and latches the signals "d" including the eight signals of the first logic circuit 713 output at the t1 point, to output signals "h". Likewise, the second posterior stage latch circuit 716 is triggered by an output signal PHASESELB from the second delay circuit 702 output at the t3 point, and latches the signals "f" including the eight signals of the second logic circuit 714 output at the t2 point, to output signals "g".

The signals "d" from the first posterior stage latch circuit 715 or signals "g" from the second posterior stage latch circuit 716 are signals that provide a reference (phase) information for skew adjustment in the PLL circuit according to this embodiment, as will be apparent in the subsequent description. In case where the PCSTART signal has risen to a high level at the t0 point where the input signal is at a low level as in this embodiment, the edge selection circuit 72 selects the signals "d" as a reference for skew adjustment, since the signals "d" from the first posterior stage latch circuit 715 can provide the reference earlier.

The edge selection circuit 72 selects and outputs either of the signals "d" from the first posterior stage latch circuit 715 or signals "g" from the second posterior stage latch circuit 716 through the switching circuit 721, as shown in FIG. 4. For controlling such switching, a signal EDGESEL generated by the third delay circuit 703 by latching the input signal at a rising edge of the PCSTART signal is employed. In this embodiment, the input signal is at a low level at a rising edge of the PCSTART signal, and according to the signal EDGESEL generated by latching such low level input signal the signals "d" from the first posterior stage latch circuit 715 are selected at the switching circuit 721, and the signals SEL0EDGE to SEL/EDGE (signals "h") are output. The edge selection circuit 72 also relays the signals "c" and signals "f" from the first and the second logic circuits 713 and 714, to output the signals SEL70 to SEL67 and SEL70B to SEL67B.

The clock selection circuit 73 outputs a multiphase pulse signal closest to a phase of the rising point t1 of the input signal among the outputs of the multiphase pulse signals "a" based on the signals "h", as a channel clock A to be provided to the phase comparator 1 of the PLL circuit. The clock selection circuit 73 also outputs a channel clock B of an opposite phase to the channel clock A and multiphase pulse signals delayed by one delay from the channel clock A and the channel clock B, as clock P1, clock P2 and clock P3 signals and clock M1, clock M2 and clock M3 signals respectively. In other words, the signals "h" change an outputting sequence of the multiphase pulse signals.

Since a signal SEL1EDGE alone is of a high level among the signals "h" in this embodiment, in the channel clock generation circuit 732 for selecting a channel clock A, only the seventh NAND circuit from the top to which the SEL1EDGE has been input outputs a multiphase pulse signal CK1DIV with its logic status inverted to be input to another terminal, which output passes through the posterior AND circuit and inverts its logic status again at the final stage NAND circuit, thus to turn into a channel clock A. Here, all the remaining six NAND circuits on the input side output a high level, which does not affect the output of the channel clock generation circuit 732. Referring to the clock P1 generation circuit 734, clock P2 generation circuit 735 and the clock P3 generation circuit 736, since an inputting sequence of the signals "a" to the NAND circuits on the input side is shifted by one delay as stated in the description of constitution and operation of the clock selection circuit 73, multiphase pulse signals respectively shifted by one delay with respect to the channel clock A are selectively output through the respective seventh NAND circuits and from the final stage NAND circuits. Outputs of the channel clock B generation circuit 733, clock M3 generation circuit 737, clock M2 generation circuit 738 and clock M1 generation circuit 739 are similarly generated, namely the channel clock B and multiphase pulse signals of a phase shifted by one delay from the channel clock B are selectively output.

Each of the clock signals output from the clock selection circuit 73 is respectively converted to advance 1 to advance 4 signals and delay 1 to delay 4 signals to be used for the skew adjustment, at the advance/delay detector 74. In other words, the advance/delay detector 74 outputs from the AND circuits 745 the advance 1, advance 2, advance 3 and advance 4 signals respectively representing an advance of (time width from a rear edge of the channel clock A to a rear edge of the clocks P1, P2, P3)×1, the same time width×2, the same time width×3, the same time width×4 (a time width corresponds to one delay width), only during a period of the input enabling signal 1 generated and output by the fourth delay circuit 741 by synchronizing a high level portion of the input signal with the channel clock A. Likewise, the advance/delay detector 74 outputs from the AND circuit 746 the delay 1, delay 2, delay 3 and delay 4 signals respectively representing a delay of (time width from a rear edge of the channel clock to a rear edge of the clocks M1, M2, M3)×1, the same time width×2, the same time width×3, the same time width×4 (a time width corresponds to one delay width), only during a period of the input enabling signal 2 generated and output by the fifth delay circuit 742 by delaying a high level portion of the input signal by one channel clock and synchronizing with the channel clock B. In this case, the advance 1 to advance 4 signals and the delay 1 to delay 4 signals do not chronologically overlap.

Then, the advance 1 to advance 4 signals and the delay 1 to delay 4 signals are input to the advance/delay output circuit 75. The advance/delay output circuit 75 selects a signal that has the optimum control amount (pulse width) for skew adjustment in accordance with a current phase variation of the input signal, through comparison between the signals "h" having phase information of the input signal at the t1 point and the signals "c" and "f" having phase information in transition according to a phase variation of the input signal in response to a subsequent phase of the multiphase pulse signal. The advance/delay output circuit 75 then outputs the selected signal as an advance signal or a delay signal. Operation of the advance/delay output circuit 75 is as below.

Firstly, since the signals "h" (SEL0EDGE to SEL7EDGE) are delayed by a high level period from the signals "c" (SEL01 to SEL70) as shown in FIG. 6, the phase information timing generation circuits 750a and 750b delay the signals "f" (SEL01B to SEL70B) and "c" respectively by the same interval, so that a timing of the signals "h" and "c" becomes accordant. Then as the example of a delay of signals "c" shown in FIG. 7, the signals SEL67 to SEL70 in the signals "c" are delayed by the input signal in the D-type flip-flop circuit. The delayed outputs turn into OUTSEL01 to OUTSEL70 and OUTSEL01B to OUTSEL70B in the signals "f'" and "c'" respectively, as shown in FIG. 12.

Secondly, the phase shift width detecting circuits 751 and 752 and the advance/delay detecting circuits 753 and 754 compare the signals "h" that serve as a reference with the signals "f'" and "c'". The phase shift width detecting circuits 751 and 752 detect an absolute value of a phase shift width, and define the shift as one phase shift to four phases shift and one phase shift B to four phases shift B, depending on the extent of shift by the delay. The advance/delay detecting circuits 753 and 754 detect whether such shift is an advance or a delay.

According to this embodiment, as is apparent in view of a relation between the signals "h" and "c'" shown in FIG. 12, since OUTSEL12 is at a high level among the signals "c'" in accordance with a high level of SEL1EDGE of the signals "h", there is no phase shift between "h" and "c'", and since OUTSEL23 among the signals "c'" is at a high level through a period of t4 to t6 while SEL1EDGE is at a high level among the signals "h", the extent of phase shift is one phase shift, and it is an advance. In this way, in the periods of t2 to t4, t6 to t8, t8 to t9, t10 and ahead of the signals "c'", the extent of phase shift is common phase, one phase shift, two phases shift and two phases shift respectively, and distinction of advance and delay is N/A (not applicable), delay, delay and advance respectively. Meanwhile referring to the signals "f'", in the periods of t3 to t5, t5 to t7, t7 to t9, t9 and ahead, the extent of phase shift is common phase, one phase shift, one phase shift and common phase respectively, and distinction of advance and delay is N/A, delay, advance and N/A respectively, similarly through comparison with the signals "h". Such results are detected in a form of high level outputs of one phase shift and two phases shift from the phase shift width detecting circuit 752 and high level outputs of advance decision and delay decision from the advance/delay decision circuit 754 respectively, as well as in a form of high level output of one phase shift B from the phase shift width detecting circuit 751 and high level outputs of advance decision B and delay decision B from the advance/delay decision circuit 754 respectively.

According to the example of the phase shift width detecting circuit 752 for detecting a phase shift width between the signals "h" (SEL0EDGE to SEL7EDGE) and "c'" (OUTSEL70 to OUTSEL01) shown in FIG. 8, for example in a period of t4 to t8, in the phase shift width detecting circuit 752 the seventh NAND circuit from the top in the logic circuit 7511 that receives an input of a high level of SEL1EDGE of the signals "h" is inputting OUTSEL12 which is shifted by one phase from the OUTSEL12 of the signals "c'" to the OR circuit on the input side, and only the above NAND circuit outputs a low level, which passes through the succeeding AND circuit to reach the final stage NAND circuit, from which a high level indicating a one phase shift is output. Likewise in the period of t2 and ahead, a high level indicating a one phase delay is output from the logic circuit 7512.

As an example of the advance/delay decision circuit 754 for detecting an advance/delay of a phase shift between the signals "h" and "c'" shown in FIG. 9, the advance decision logic circuit 7541 detects a high level for advance decision in the periods of t4 to t6 and t10 and ahead corresponding to one phase shift, while the delay decision logic circuit 7542 detects a high level for delay decision in the period of t6 to t10 corresponding to one phase shift and two phases shift.

Likewise the phase shift width detecting circuit 751 detects a width of a phase shift between the signals "h" and the signals "f'" (OUTSEL01B to OUTSEL70B). As is apparent in view of a relation between the signals "h" and "f'" shown in FIG. 12, a high level indicating a one phase delay B is output only during the period of t5 to t9. In the advance/delay decision circuit 753, the delay decision logic circuit 7532 outputs a high level for a delay decision B during t5 to t7, and the advance decision logic circuit 7531 outputs a high level for an advance decision B during t7 to t9.

Then, in the advance/delay decision output circuit 755, shown in FIG. 10, an accordant output among the combinations of each signal indicating a one phase to four phases shift with each of the advance 1 to advance 4 signals is output from the first advance/delay decision logic circuit 7551 and the second advance/delay decision logic circuit 7552, and further a high level period alone for an advance decision or a delay decision, thus to output the advance decision signal or delay decision signal shown in FIG. 12. Likewise in the advance/delay decision output circuit 756, an accordant output among the combinations of each signal indicating a one phase to four phases shift with each of the advance 1 to advance 4 signals is output from the first advance/delay decision logic circuit 7561 and the second advance/delay decision logic circuit 7562, and further a high level period alone for an advance decision or a delay decision is output, thus to output the advance decision B signal or delay decision B signal shown in FIG. 12.

The advance decision signal or delay decision signal, as well as the advance decision B signal or delay decision B signal are output as a signal having a pulse width proportionate to a phase shift of each high level period and low level period of the input signal as long as a phase shift remains, as is apparent from the FIG. 12. Each of such signals are caused to alternately pass through the output AND circuits 757, 758 by gating the advance decision signal or delay decision signal and the advance decision B signal or delay decision B signal with the input signal or an inverted signal thereof, and the advance decision and advance decision B signals, as well as the delay decision and delay decision B signals are merged in the output OR circuit 759 to generate a decision signal of an advance or delay, which is then output as a skew adjusting signal.

The skew adjusting circuit 8, shown in FIG. 1, receives the advance signal and the delay signal defined by a voltage pulse width, and convert such signals into a current having a pulse width by the skew adjusting charge pump. Then the LPF filter 3 connected ahead of the skew adjusting circuit 8 serves to output a voltage in accordance with a pulse width difference between a current I pskewout running from VDD toward VC and a current I nskewout running from VC to GND. Since the LPF filter 3 is also affected by a difference of a current pulse width between a current I cgp_p representing a rising instruction signal and I cgp_n representing a falling instruction signal both output from the phase comparator, a total value of these factors are input as VC.

According to the foregoing embodiment, as shown in FIGS. 3 through 10, the PLL circuit for phase lock control is provided with the latch circuit 71, edge circuit 72, clock selection circuit 73, advance/delay detector 74 and advance/delay output circuit 75 in a dual constitution so that the phase controlled oscillator is controlled based on a phase difference from an output of the phase controlled oscillator at both the front edge and rear edge of the input signal, while it is also possible to employ a single constitution for the respective above dual components, in case where the phase lock control is to be performed only at a front edge or rear edge of the input signal.

Also, in the foregoing embodiment, since a more precise phase lock loop is formed through an operation of the skew adjusting circuit 8 when an advance signal and delay signal are output from the selection circuit 7 after the phase lock operation by the phase comparator 1 is activated in the PLL circuit by a PCSTART signal, it is possible to employ the skew adjusting circuit 8 for the subsequent phase locking operation on behalf of the phase comparator 1. For example, the circuitry can be constituted in such a manner that the skew adjusting circuit 8 practically becomes a key control factor, or that the use of the phase comparator 1 and charge pump 2 is suspended.

Further, according to the foregoing embodiment the first and the second anterior stage larch circuits (the first latch circuit 711 and the first logic circuit 713, the second latch circuit 712 and the second logic circuit 714) in the latch circuit 71 of the invention are designed to detect and output an initial phase of the four continuous high level of the signals "b" as already described, while it is also possible to arrange so that the four continuous high levels of the signals "b" are output as they are. In other words, the first logic circuit 713 and the second logic circuit 714 can be removed, and the first and second posterior stage latch circuits (the first posterior stage latch circuit 715, the second posterior stage latch circuit 716) can be arranged to directly latch the output of the anterior circuits. In this case, by providing components having an equivalent function to the first logic circuit 713 and the second logic circuit 714 between the output side of the first and second anterior stage latch circuits and the input side of the edge selection circuit 72, and between the output side of the first and second posterior stage latch circuits and the input side of the edge selection circuit 72 respectively, the same operation can be performed without any variation in the subsequent stage circuits. Consequently, as far as the latch circuit 71 is concerned, whichever constitution may be adopted, a practically equivalent constitution can be attained to that of the invention, i.e. having an anterior stage latch circuit for latching a multiphase pulse signal with the input signal and outputting phase information of a multiphase pulse signal of a closest phase to the latching point and a posterior stage latch circuit for latching the output of the anterior stage latch circuit at a single generation point of the input signal after generation of the activating signal.

According to the invention, in a PLL circuit for comparing a phase between an input signal and one of multiphase pulse signals used as a channel clock generated by an output of a controlled oscillator, and controlling an oscillation of the controlled oscillator according to a phase difference signal, an activating signal generated for activating the PLL circuit when the input signal is nearly equivalent to a frequency of the channel crock and has entered into a capture range of the phase comparator activates the phase comparator, so that the controlled oscillator is controlled with the phase difference signal, and the multiphase pulse signal having a closest phase to a first rising (or falling) timing of the input signal is selected as the channel clock in the phase pull-in operation after generation of the activating signal, therefore a pull-in time can be remarkably shortened.

Also, in a constant phase locked state after the activation of the PLL circuit, the multiphase pulse signal instantaneously determined by the input signal immediately after the activation remains fixed as the channel clock, so that the selection circuit detects whether a signal is advanced or delayed with respect to the channel clock. In other words, a first latch circuit for latching the multiphase pulse signal at each generation timing of the input signal after generation of the activating signal and a second latch circuit for latching an output of the first latch circuit at a single timing after a generation timing of the input signal are provided, and a control signal in accordance with a phase difference between the input signal and the channel clock is output based on variation of output status from the first latch circuit with respect to output status from the second latch circuit so that a skew is controlled by such control signal, therefore a phase at the initial activation can be constantly used as a reference for comparison with subsequent phase variation, which enables a high precision control of a phase according to phase variation such as a skew of a controlled oscillator, and a very accurate phase locking with a phase of the input signal.

What is claimed is:

1. A PLL circuit, comprising:
   a controlled oscillator for outputting multiphase pulse signals;
   a phase comparator for comparing a phase between an input signal and one of said multiphase pulse signals used as a channel clock to generate a phase difference signal, and controlling an oscillation of said controlled oscillator according to said phase difference signal;
   a frequency fixing circuit for outputting an activating signal for said controlling when said input signal is nearly equivalent to a frequency of said channel clock and has entered into a capture range of said phase comparator; and
   a selection circuit for selecting one of said multiphase pulse signals which has a closest phase to a generating point of said input signal after generation of said activating signal as said channel clock.

2. The PLL circuit as set forth in claim 1, further comprising a skew adjusting circuit for adjusting a skew of said controlled oscillator, wherein said selection circuit decides whether said input signal is advanced or delayed with respect to said channel clock after having selected a multiphase pulse signal as said channel clock and generates either an advance signal or delay signal according to an advance/delay of said input signal, for controlling said skew adjusting circuit with said advance signal or said delay signal.

3. The PLL circuit as set forth in claim 2, wherein said selection circuit comprises an anterior stage latch circuit for latching multiphase pulse signals by said input signal and outputting a phase information of a multiphase pulse signal of a closest phase to said latching point; a posterior stage latch circuit for latching an output of said anterior stage latch circuit at a single generating point of an input signal after generation of said activating signal; and a phase control signal generation circuit for selectively outputting said channel clock based on an output status of said posterior stage latch circuit and said multiphase pulse signal, and outputting an advance signal or a delay signal in accordance with a phase difference between said input signal and said channel clock based on variation of an output status of said anterior stage latch circuit in response to said output status of said posterior stage latch circuit.

4. The PLL circuit as set forth in claim 3, wherein said anterior stage latch circuit includes a first anterior stage latch circuit for latching a multiphase signal at a front edge of said input signal and a second anterior stage latch circuit for latching said multiphase pulse signal at a rear edge of said input signal, and said posterior stage latch circuit includes a first posterior stage latch circuit for latching an output of said first anterior stage latch circuit at a rear edge of said first input signal after generation of said activating signal and a second posterior stage latch circuit for latching an output of said second anterior stage latch circuit at a front edge of said second input signal after generation of said activating signal, wherein said PLL circuit further comprising an edge selection circuit for outputting output of said first and said second anterior stage latch circuit and output of said first or said second posterior stage latch circuit latched first after generation of said activating signal, to said phase control signal generation circuit.

5. The PLL circuit as set forth in claim 4, wherein said phase control signal generation circuit comprises a clock selection circuit for selectively outputting said channel clock based on output of said first or said second posterior stage latch circuit output by said edge selection circuit and said multiphase pulse signal; an advance/delay detecting circuit for generating a plurality of advance signals and delay signals having a pulse width corresponding to a phase difference of said multiphase pulse signal with respect to said channel clock; and an advance/delay output circuit for selectively outputting said plurality of either advance signals or delay signals according to an output of said edge selection circuit.

6. The PLL circuit as set forth in claim 5, wherein said advance/delay output circuit comprises a first phase shift width detecting circuit for detecting a phase shift width with respect to said channel clock and a first advance/delay decision circuit for deciding whether said phase shift is an advance or a delay, to both of which said output of said clock selection circuit corresponding to said output of said first anterior stage latch circuit is to be respectively input; a first advance/delay decision output circuit for selecting either an advance signal or a delay signal having a pulse width corresponding to said phase shift out of said plurality of advance signals or delay signals according to said phase shift width and advance/delay of said phase shift and outputting such advance signal or delay signal as a first advance decision signal or a first delay decision signal; a second phase shift width detecting circuit for detecting a phase shift width with respect to said channel clock and a second advance/delay decision circuit for deciding whether said phase shift is an advance or a delay, to both of which said output of said clock selection circuit corresponding to said output of said second anterior stage latch circuit is to be respectively input; a second advance/delay decision output circuit for selecting either an advance signal or a delay signal having a pulse width corresponding to said phase shift out of said plurality of advance signals or delay signals according to said phase shift width and advance/delay of said phase shift and outputting such advance signal or delay signal as a second advance decision signal or a second delay decision signal; and an output logic circuit for alternately switching and outputting said first advance decision signal or said second advance decision signal and said first delay decision signal or said second delay decision signal respectively as said advance signal and said delay signal, according to a logic status of said input signal.

7. The PLL circuit as set forth in claim 2, wherein said skew adjustment circuit controls an oscillation of said controlled oscillator on behalf of said phase comparator, after generation of said advance signal or said delay signal.

8. The PLL circuit as set forth in claim 7, wherein said selection circuit comprises an anterior stage latch circuit for latching a multiphase pulse signal by said input signal and outputting a phase information of a multiphase pulse signal of a closest phase to said latching point; a posterior stage latch circuit for latching an output of said anterior stage latch circuit at a single generating point of an input signal after generation of said activating signal; and a phase control signal generation circuit for selectively outputting said channel clock based on an output status of said posterior stage latch circuit and said multiphase pulse signal, and outputting an advance signal or a delay signal in accordance with a phase difference between said input signal and said channel clock based on variation of an output status of said anterior stage latch circuit in response to said output status of said posterior stage latch circuit.

9. The PLL circuit as set forth in claim 8, wherein said anterior stage latch circuit includes a first anterior stage latch circuit for latching a multiphase signal at a front edge of said input signal and a second anterior stage latch circuit for latching said multiphase pulse signal at a rear edge of said input signal, and said posterior stage latch circuit includes a first posterior stage latch circuit for latching an output of said first anterior stage latch circuit at a rear edge of said first input signal after generation of said activating signal and a second posterior stage latch circuit for latching an output of said second anterior stage latch circuit at a front edge of said second input signal after generation of said activating signal, wherein said PLL circuit further comprising an edge selection circuit for outputting output of said first and said second anterior stage latch circuit and output of said first or said second posterior stage latch circuit latched first after generation of said activating signal, to said phase control signal generation circuit.

10. The PLL circuit as set forth in claim 9, wherein said phase control signal generation circuit comprises a clock selection circuit for selectively outputting said channel clock based on output of said first or said second posterior stage latch circuit output by said edge selection circuit and said multiphase pulse signal; an advance/delay detecting circuit for generating a plurality of advance signals and delay signals having a pulse width corresponding to a phase difference of said multiphase pulse signal with respect to said channel clock; and an advance/delay output circuit for selectively outputting said plurality of either advance signals or delay signals according to an output of said edge selection circuit.

11. The PLL circuit as set forth in claim 10, wherein said advance/delay output circuit comprises a first phase shift width detecting circuit for detecting a phase shift width with respect to said channel clock and a first advance/delay decision circuit for deciding whether said phase shift is an advance or a delay, to both of which said output of said clock selection circuit corresponding to said output of said first anterior stage latch circuit is to be respectively input; a first advance/delay decision output circuit for selecting either an advance signal or a delay signal having a pulse width corresponding to said phase shift out of said plurality of advance signals or delay signals according to said phase shift width and advance/delay of said phase shift and outputting such advance signal or delay signal as a first advance decision signal or a first delay decision signal; a second phase shift width detecting circuit for detecting a phase shift width with respect to said channel clock and a second advance/delay decision circuit for deciding whether said phase shift is an advance or a delay, to both of which said output of said clock selection circuit corresponding to said output of said second anterior stage latch circuit is to be respectively input; a second advance/delay decision output circuit for selecting either an advance signal or a delay signal having a pulse width corresponding to said phase shift out of said plurality of advance signals or delay signals according to said phase shift width and advance/delay of said phase shift and outputting such advance signal or delay signal as a second advance decision signal or a second delay decision signal; and an output logic circuit for alternately switching and outputting said first advance decision signal or said second advance decision signal and said first delay decision signal or said second delay decision signal respectively as said advance signal and said delay signal, according to a logic status of said input signal.

12. A phase difference detecting circuit to be incorporated in a PLL circuit provided with a controlled oscillator for generating a multiphase pulse signal, comprising:

an anterior stage latch circuit for latching a multiphase pulse signal by said input signal and outputting a phase information of a multiphase pulse signal of a closest phase to said latching point;

a posterior stage latch circuit for latching an output of said anterior stage latch circuit at a single generating point of an input signal after generation of said activating signal; and a phase control signal generation circuit for selectively outputting said channel clock based on an output status of said posterior stage latch circuit and said multiphase pulse signal, and outputting an advance signal or a delay signal in accordance with a phase difference between said input signal and said channel clock based on variation of an output status of said anterior stage latch circuit in response to said output status of said posterior stage latch circuit.

13. The phase difference detecting circuit as set forth in claim 12, wherein said anterior stage latch circuit includes a first anterior stage latch circuit for latching a multiphase signal at a front edge of said input signal and a second anterior stage latch circuit for latching said multiphase pulse signal at a rear edge of said input signal, and said posterior stage latch circuit includes a first posterior stage latch circuit for latching an output of said first anterior stage latch circuit at a rear edge of said first input signal after generation of said activating signal and a second posterior stage latch circuit for latching an output of said second anterior stage latch circuit at a front edge of said second input signal after generation of said activating signal, further comprising an edge selection circuit for outputting to said phase control signal generation circuit said output of said first and said second anterior stage latch circuit and said output of said first or said second posterior stage latch circuit latched first after generation of said activating signal.

14. The phase difference detecting circuit as set forth in claim 13, wherein said phase control signal generation circuit comprises a clock selection circuit for selectively outputting said channel clock based on said output of said first or said second posterior stage latch circuit output by said edge selection circuit and said multiphase pulse signal; an advance/delay detecting circuit for generating a plurality of advance signals and delay signals having a pulse width corresponding to a phase difference of said multiphase pulse signal with respect to said channel clock; and an advance/delay output circuit for selectively outputting said plurality of either advance signals or delay signals according to an output of said edge selection circuit.

15. The phase difference detecting circuit as set forth in claim 14, wherein said advance/delay output circuit comprises a first phase shift width detecting circuit for detecting a phase shift width with respect to said channel clock and a first advance/delay decision circuit for deciding whether said phase shift is an advance or a delay, to both of which said output of said clock selection circuit corresponding to said output of said first anterior stage latch circuit is to be respectively input; a first advance/delay decision output circuit for selecting either an advance signal or a delay signal having a pulse width corresponding to said phase shift out of said plurality of advance signals or delay signals according to said phase shift width and advance/delay of said phase shift and outputting such advance signal or delay signal as a first advance decision signal or a first delay decision signal; a second phase shift width detecting circuit for detecting a phase shift width with respect to said channel clock and a second advance/delay decision circuit for deciding whether said phase shift is an advance or a delay, to both of which said output of said clock selection circuit corresponding to said output of said second anterior stage latch circuit is to be respectively input; a second advance/delay decision output circuit for selecting either an advance signal or a delay signal having a pulse width corresponding to said phase shift out of said plurality of advance signals or delay signals according to said phase shift width and advance/delay of said phase shift and outputting such advance signal or delay signal as a second advance decision signal or a second delay decision signal; and an output logic circuit for alternately switching and outputting said first advance decision signal or said second advance decision signal and said first delay decision signal or said second delay decision signal respectively as said advance signal and said delay signal, according to a logic status of said input signal.

* * * * *